(12) United States Patent
Tsubuku et al.

(10) Patent No.: US 9,349,875 B2
(45) Date of Patent: May 24, 2016

(54) SEMICONDUCTOR DEVICE AND ELECTRONIC DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Masashi Tsubuku, Kanagawa (JP); Toshihiko Takeuchi, Kanagawa (JP); Yasumasa Yamane, Kanagawa (JP); Masashi Oota, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/733,081

(22) Filed: Jun. 8, 2015

(65) Prior Publication Data

US 2015/0364610 A1    Dec. 17, 2015

(30) Foreign Application Priority Data

Jun. 13, 2014  (JP) ................................. 2014-122284

(51) Int. Cl.
*H01L 27/14* (2006.01)
*H01L 29/786* (2006.01)
(Continued)

(52) U.S. Cl.
CPC .... *H01L 29/78696* (2013.01); *H01L 21/02554* (2013.01); *H01L 21/02631* (2013.01);
(Continued)

(58) Field of Classification Search
CPC ................... H01L 29/78696; H01L 29/7869; H01L 29/66969; H01L 29/045; H01L 29/1033; H01L 21/02631

USPC ......................... 257/43, 59, 72, 432; 438/149
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| CN | 101375405 A | 2/2009 |
| EP | 1737044 A | 12/2006 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Tan N Tran
(74) *Attorney, Agent, or Firm* — Fish & Richardson P.C.

(57) ABSTRACT

A semiconductor device includes a first oxide semiconductor film, a second oxide semiconductor film over the first oxide semiconductor film, a source electrode in contact with the second oxide semiconductor film, a drain electrode in contact with the second oxide semiconductor film, a metal oxide film over the second oxide semiconductor film, the source electrode, and the drain electrode, a gate insulating film over the metal oxide film, and a gate electrode over the gate insulating film. The metal oxide film contains M (M represents Ti, Ga, Y, Zr, La, Ce, Nd, or Hf) and Zn. The metal oxide film includes a portion where $x/(x+y)$ is greater than 0.67 and less than or equal to 0.99 when a target has an atomic ratio of M:Zn=x:y.

26 Claims, 31 Drawing Sheets

(51) Int. Cl.
*H01L 29/66* (2006.01)
*H01L 29/04* (2006.01)
*H01L 29/10* (2006.01)
*H01L 21/02* (2006.01)
*H01L 21/477* (2006.01)

(52) U.S. Cl.
CPC ............ *H01L21/477* (2013.01); *H01L 29/045* (2013.01); *H01L 29/1033* (2013.01); *H01L 29/66969* (2013.01); *H01L 29/7869* (2013.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,906,780 | B2 | 3/2011 | Iwasaki |
| 8,502,221 | B2 | 8/2013 | Yamazaki |
| 8,669,556 | B2 | 3/2014 | Yamazaki et al. |
| 9,064,853 | B2 | 6/2015 | Nomura et al. |
| 9,214,474 | B2 | 12/2015 | Yamazaki |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0174012 | A1 | 7/2009 | Iwasaki |
| 2009/0278122 | A1 | 11/2009 | Hosono et al. |
| 2009/0280600 | A1 | 11/2009 | Hosono et al. |
| 2009/0321731 | A1 | 12/2009 | Jeong et al. |
| 2010/0006834 | A1 | 1/2010 | Kim et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0180802 | A1 | 7/2011 | Morosawa et al. |
| 2011/0240991 | A1 | 10/2011 | Yamazaki |
| 2013/0043466 | A1 | 2/2013 | Nomura et al. |
| 2013/0048977 | A1 | 2/2013 | Watanabe et al. |
| 2013/0208207 | A1 | 8/2013 | Okamoto et al. |
| 2014/0008647 | A1 | 1/2014 | Yamazaki |
| 2014/0131701 | A1 | 5/2014 | Watanabe et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-201366 A | 8/2007 |
| JP | 2012-119672 A | 6/2012 |
| JP | 2014-030012 A | 2/2014 |
| JP | 2014-116591 A | 6/2014 |
| TW | 201427011 | 7/2014 |

(56) References Cited

FOREIGN PATENT DOCUMENTS

| WO | WO-2004/114391 | 12/2004 |
|---|---|---|
| WO | WO-2007/086291 | 8/2007 |
| WO | WO-2014/077207 | 5/2014 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model For the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates. D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-BandGap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphos In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure For Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID International Symposium Digest of Technical Papers, May 20, 2008, vol. 39, pp. 621-624.

Hirao.T et al., "Novel Top-Gate Zinc Oxide Thin-Film Transistors (ZnO TFTs) For AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin-Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic NANO-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn]at Temperatures over 1000° C.", Journal of Solid State Chemistry, 1985, vol. 60, pp. 382-384.

Kimizuka.N et al., "Syntheses and Single-Chrystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conduction Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga, m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholestreric Liquid Crystals", Phys. Rev. Lett. (Physical Review Letters), May 4, 1981, vol. 46, No. 18, pp. 1216-1219.

Miyasaka.M "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2:Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, pp. H1009-H1014.

Ohara.H et al., "21.3:4.0 in QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-330, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-151.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circiut Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2015/053947) Dated Oct. 6, 2015.

Written Opinion (Application No. PCT/IB2015/053947) Dated Oct. 6, 2015.

SEMICONDUCTOR DEVICE AND ELECTRONIC DEVICE INCLUDING THE SEMICONDUCTOR DEVICE

TECHNICAL FIELD

One embodiment of the present invention relates to a semiconductor device and a manufacturing method thereof.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

BACKGROUND ART

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film applicable to the transistor, but an oxide semiconductor has been attracting attention as an alternative material.

For example, a technique for manufacturing a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices.

REFERENCES

[Patent Document 1] Japanese Published Patent Application No. 2007-123861
[Patent Document 2] Japanese Published Patent Application No. 2007-96055

DISCLOSURE OF INVENTION

Miniaturization of transistors has been progressing with an increase in the degree of integration of circuits. Miniaturization of transistors may cause deterioration of the electrical characteristics of the transistors, such as on-state current, off-state current, threshold voltage, and a subthreshold swing (S value). In general, a decrease in channel length leads to an increase in off-state current, an increase in fluctuation of threshold voltage, and an increase in S value. In addition, a decrease in channel width leads to a decrease in on-state current.

An object of one embodiment of the present invention is to provide a semiconductor device with favorable electrical characteristics. Another object is to provide a semiconductor device with high on-state current. Another object is to provide a semiconductor device that is suitable for miniaturization. Another object is to provide a highly integrated semiconductor device. Another object is to provide a semiconductor device with low power consumption. Another object is to provide a highly reliable semiconductor device. Another object is to provide a semiconductor device that can retain data even when power supply is stopped. Another object is to provide a novel semiconductor device.

Note that the descriptions of these objects do not disturb the existence of other objects. In one embodiment of the present invention, there is no need to achieve all the objects. Other objects will be apparent from and can be derived from the descriptions of the specification, the drawings, the claims, and the like.

One embodiment of the present invention is a semiconductor device which includes a first oxide semiconductor film, a second oxide semiconductor film over the first oxide semiconductor film, a source electrode in contact with the second oxide semiconductor film, a drain electrode in contact with the second oxide semiconductor film, a metal oxide film over the second oxide semiconductor film, the source electrode, and the drain electrode, a gate insulating film over the metal oxide film, and a gate electrode over the gate insulating film. The metal oxide film contains M (M represents Al, Mn, Mg, Ti, Ga, Y, Zr, La, Ce, Nd, or Hf) and Zn. The metal oxide film includes a portion where $x/(x+y)$ is greater than 0.67 and less than or equal to 0.99 when a target has an atomic ratio of M:Zn=x:y.

One embodiment of the present invention is a semiconductor device which includes a first oxide semiconductor film, a second oxide semiconductor film over the first oxide semiconductor film, a source electrode in contact with the second oxide semiconductor film, a drain electrode in contact with the second oxide semiconductor film, a metal oxide film over the second oxide semiconductor film, the source electrode, and the drain electrode, a gate insulating film over the metal oxide film, and a gate electrode over and in contact with the gate insulating film and facing an upper surface and a side surface of the second oxide semiconductor film. The metal oxide film contains M (M represents Al, Mn, Mg, Ti, Ga, Y, Zr, La, Ce, Nd, or Hf) and Zn. The metal oxide film includes a portion where $x/(x+y)$ is greater than 0.67 and less than or equal to 0.99 when a target has an atomic ratio of M:Zn=x:y.

In the above embodiment, it is preferable that the metal oxide film contains Ga as the element M.

In the above embodiment, it is preferable that the second oxide semiconductor film include a plurality of crystal parts having c-axis alignment, and that c-axes of the plurality of crystal parts be aligned in a direction parallel to a normal vector to an upper surface of the second oxide semiconductor film.

In the above embodiment, the channel length may be greater than or equal to 5 nm and less than or equal to 200 nm.

In the above embodiment, it is preferable that the electron affinity of the second oxide semiconductor film be higher than the electron affinity of the first oxide semiconductor film.

Another embodiment of the present invention is an electronic device which includes the semiconductor device in the above embodiment.

In one embodiment of the present invention, any of the following semiconductor devices can be provided: a semiconductor device with favorable electrical characteristics, a semiconductor device that is suitable for miniaturization, a semiconductor device with high on-state current, a highly integrated semiconductor device, a semiconductor device with low power consumption, a highly reliable semiconductor device, a semiconductor device which can retain data even when power supply is stopped, and a novel semiconductor device.

Note that the descriptions of these effects do not disturb the existence of other effects. One embodiment of the present invention does not necessarily achieve all the above effects. Other effects will be apparent from and can be derived from the descriptions of the specification, the drawings, the claims, and the like.

BEST MODE FOR CARRYING OUT THE INVENTION

Figure 1A:
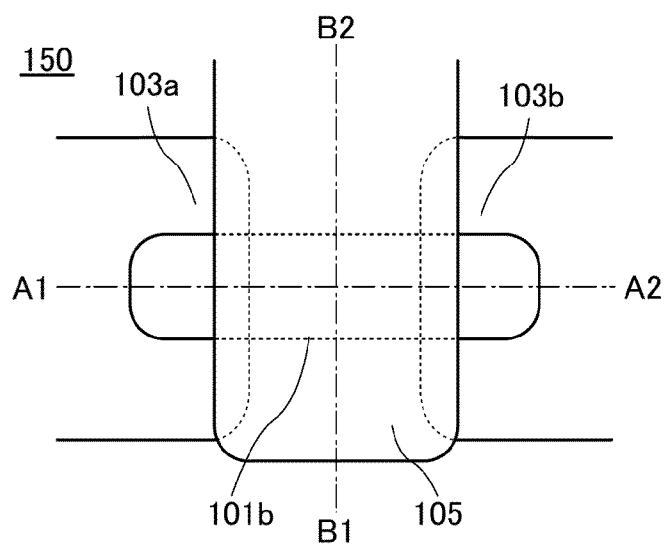
FIGS. 1A to 1C are a top view and cross-sectional views illustrating a transistor.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases. It is also to be noted that the same components are denoted by different hatching patterns in different drawings, or the hatching patterns are omitted in some cases.

Furthermore, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes interchanged with each other when the direction of current flow is changed in circuit operation, for example. Therefore, the terms "source" and "drain" can be used to denote the drain and the source, respectively, in this specification.

A voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

A transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a semiconductor device which is one embodiment of the present invention and a manufacturing method thereof will be described with reference to drawings. As an example of a semiconductor device, a transistor will be described.

In a transistor of one embodiment of the present invention, silicon (including strained silicon), germanium, silicon germanium, silicon carbide, gallium arsenide, aluminum gallium arsenide, indium phosphide, gallium nitride, an organic semiconductor, an oxide semiconductor, or the like can be used for a channel formation region. It is particularly preferable to use an oxide semiconductor having a wider band gap than silicon for the channel formation region.

For example, the oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, Mg, Nd, or Hf).

In the description below, unless otherwise specified, a transistor described as an example includes an oxide semiconductor in a channel formation region.

Figure 1B:
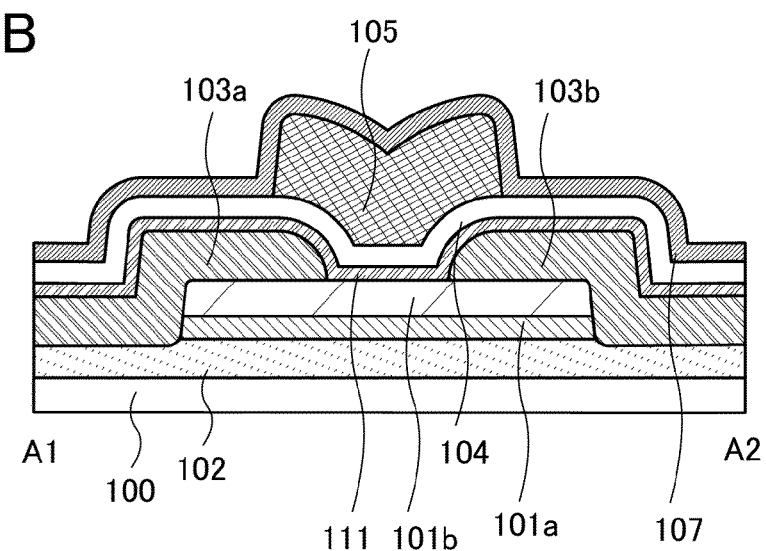
Figure 1C:
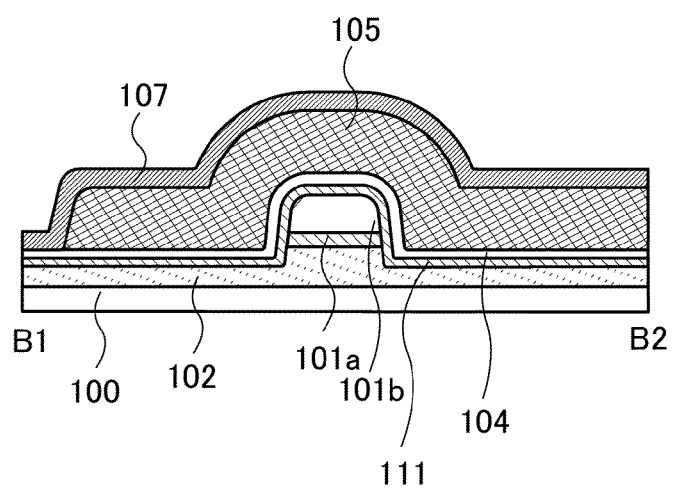

FIGS. 1A to 1C are a top view and cross-sectional views illustrating a transistor 150 included in a semiconductor device. FIG. 1A is a top view of the transistor 150. FIG. 1B is a cross-sectional view taken along dashed-dotted line A1-A2 in FIG. 1A. FIG. 1C is a cross-sectional view taken along dashed-dotted line B1-B2 in FIG. 1A. In FIGS. 1A to 1C, some components are enlarged, reduced in size, or omitted for easy understanding. In some cases, the direction of the dashed-dotted line A1-A2 is referred to as a channel length direction, and the direction of the dashed-dotted line B1-B2 is referred to as a channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the width of a source or a drain in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width, that is, the length of a portion where a source and a drain face each other in a region where a semiconductor and a gate electrode overlap with each other, is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that the channel length of a transistor is preferably greater than or equal to 5 nm and less than or equal to 200 nm, more preferably greater than or equal to 10 nm and less than or equal to 100 nm, further preferably greater than or equal to 20 nm and less than or equal to 40 nm. The channel width is preferably less than or equal to 50 nm, more preferably less than or equal to 30 nm, further preferably less than or equal to 20 nm.

The transistor 150 illustrated in FIGS. 1A to 1C includes a base insulating film 102 over a substrate 100, an oxide semiconductor film 101*a* over the base insulating film 102, an oxide semiconductor film 101*b* over the oxide semiconductor film 101*a*, a source electrode 103*a* and a drain electrode 103*b* in contact with the base insulating film 102 and the oxide semiconductor film 101*b*, a metal oxide film 111 over the source electrode 103*a* and the drain electrode 103*b*, a gate insulating film 104 over the metal oxide film 111, and a gate electrode 105 overlapping with the oxide semiconductor film 101*b* with the gate insulating film 104 provided therebetween. An insulating film 107 is provided over the gate insulating film 104 and the gate electrode 105.

Note that at least part (or all) of the source electrode 103*a* (and/or the drain electrode 103*b*) is provided on at least part (or all) of a surface, a side surface, and/or a bottom surface of a semiconductor film such as the oxide semiconductor film 101*a* (and/or the oxide semiconductor film 101*b*).

Alternatively, at least part (or all) of the source electrode 103*a* (and/or the drain electrode 103*b*) is in contact with at least part (or all) of a surface, a side surface, and/or a bottom surface of a semiconductor film such as the oxide semiconductor film 101*a* (and/or the oxide semiconductor film 101*b*). Alternatively, at least part (or all) of the source electrode 103*a* (and/or the drain electrode 103*b*) is in contact with at least part (or all) of a semiconductor film such as the oxide semiconductor film 101*a* (and/or the oxide semiconductor film 101*b*).

Alternatively, at least part (or all) of the source electrode 103*a* (and/or the drain electrode 103*b*) is electrically connected to at least part (or all) of a surface, a side surface, and/or a bottom surface of a semiconductor film such as the oxide semiconductor film 101a (and/or the oxide semiconductor film 101b). Alternatively, at least part (or all) of the source electrode 103a (and/or the drain electrode 103b) is electrically connected to at least part (or all) of a semiconductor film such as the oxide semiconductor film 101a (and/or the oxide semiconductor film 101b).

Alternatively, at least part (or all) of the source electrode 103a (and/or the drain electrode 103b) is provided near at least part (or all) of a surface, a side surface, and/or a bottom surface of a semiconductor film such as the oxide semiconductor film 101a (and/or the oxide semiconductor film 101b). Alternatively, at least part (or all) of the source electrode 103a (and/or the drain electrode 103b) is provided near at least part (or all) of a semiconductor film such as the oxide semiconductor film 101a (and/or the oxide semiconductor film 101b).

Alternatively, at least part (or all) of the source electrode 103a (and/or the drain electrode 103b) is placed on a side of at least part (or all) of a surface, a side surface, and/or a bottom surface of a semiconductor film such as the oxide semiconductor film 101a (and/or the oxide semiconductor film 101b). Alternatively, at least part (or all) of the source electrode 103a (and/or the drain electrode 103b) is placed on a side of at least part (or all) of a semiconductor film such as the oxide semiconductor film 101a (and/or the oxide semiconductor film 101b).

Alternatively, at least part (or all) of the source electrode 103a (and/or the drain electrode 103b) is provided obliquely above at least part (or all) of a surface, a side surface, and/or a bottom surface of a semiconductor film such as the oxide semiconductor film 101a (and/or the oxide semiconductor film 101b). Alternatively, at least part (or all) of the source electrode 103a (and/or the drain electrode 103b) is provided obliquely above at least part (or all) of a semiconductor film such as the oxide semiconductor film 101a (and/or the oxide semiconductor film 101b).

Alternatively, at least part (or all) of the source electrode 103a (and/or the drain electrode 103b) is provided above at least part (or all) of a surface, a side surface, and/or a bottom surface of a semiconductor film such as the oxide semiconductor film 101a (and/or the oxide semiconductor film 101b). Alternatively, at least part (or all) of the source electrode 103a (and/or the drain electrode 103b) is provided above at least part (or all) of a semiconductor film such as the oxide semiconductor film 101a (and/or the oxide semiconductor film 101b).

For the metal oxide film 111, a metal oxide containing M (M represents Al, Mn, Mg, Ti, Ga, Y, Zr, La, Ce, Nd, or Hf) and Zn can be used. Note that to prevent the metal oxide film 111 from functioning as part of a channel formation region, a material having sufficiently low conductivity is used. Alternatively, a material which has a lower electron affinity (an energy difference between the vacuum level and the conduction band minimum) than the oxide semiconductor film 101b and has a difference in conduction band minimum from the oxide semiconductor film 101b (band offset) is used for the metal oxide film 111.

When a sputtering target used to form the metal oxide film 111 contains metal elements at an atomic ratio of M:Zn=x:y, x/(x+y) is greater than 0.67 and less than or equal to 0.99, preferably greater than 0.75 and less than or equal to 0.95, further preferably greater than or equal to 0.83 and less than or equal to 0.91. For example, the atomic ratio of metal elements in such a sputtering target used to form the metal oxide film is preferably M:Zn=10:1 or the like. Note that an element other than M, Zn, and oxygen that are main components may be mixed in the metal oxide film 111 as an impurity. In that case, the concentration of the impurity is preferably less than or equal to 0.1%. Furthermore, when the formed metal oxide film 111 has an atomic ratio of M:Zn=a:b, a/(a+b) is preferably greater than 0.77 and less than or equal to 0.97, further preferably greater than or equal to 0.89 and less than or equal to 0.94.

Note that in the transistor 150, side surfaces of the oxide semiconductor film 101b where the channel is formed are in contact with the source electrode 103a and the drain electrode 103b, and in the contact regions, a source region and a drain region are formed. Therefore, the metal oxide film 111 may have an insulating property.

The details of other components of the transistor 150 will be described below.

In this embodiment, a film positioned near the oxide semiconductor film 101b, typically the base insulating film 102 or the gate insulating film 104, is preferably an oxide insulating film containing nitrogen and having a small number of defects.

Typical examples of the oxide insulating film containing nitrogen and having a small number of defects include a silicon oxynitride film and an aluminum oxynitride film. Note that an "oxynitride film" such as a silicon oxynitride film or an aluminum oxynitride film refers to a film that contains more oxygen than nitrogen, and a "nitride oxide film" such as a silicon nitride oxide film or an aluminum nitride oxide film refers to a film that contains more nitrogen than oxygen.

In an ESR spectrum at 100 K or lower of the oxide insulating film having a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. In this embodiment, the expression "signal is observed" means that a spin density of higher than or equal to $4.7 \times 10^{15}$ spins/cm$^3$ is observed at a specified g-factor. The distance between the first and second signals and the distance between the second and third signals that are obtained by ESR measurement using an X-band are each approximately 5 mT. The sum of the spin densities of the first to third signals is lower than $4 \times 10^{18}$ spins/cm$^3$, typically higher than or equal to $2.4 \times 10^{18}$ spins/cm$^3$ and lower than $4 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

In the oxide insulating film containing nitrogen and having a small number of defects, the nitrogen concentration and the hydrogen concentration become lower as the deposition temperature increases. The oxide insulating film is formed typically at a temperature higher than or equal to 500° C., preferably higher than or equal to 500° C. and lower than or equal to 550° C. When oxygen is added after the nitrogen concentration is reduced, generation of nitrogen oxide can be suppressed; thus, oxygen can be added to the oxide insulating film and can be supplied to the oxide semiconductor film 101*b*.

When the base insulating film 102 or the gate insulating film 104 which is positioned near the oxide semiconductor film 101*b* contains a small amount of nitrogen oxide as described above, the carrier trap at the interface between the base insulating film 102 or the gate insulating film 104 and the oxide semiconductor film can be inhibited. Consequently, a shift in the threshold voltage of the transistor included in the semiconductor device can be inhibited, which leads to a reduced change in the electrical characteristics of the transistor.

The base insulating film 102 and the gate insulating film 104 each preferably have a portion in which the nitrogen concentration measured by secondary ion mass spectrometry (SIMS) is lower than $1 \times 10^{20}$ atoms/cm$^3$. In that case, a nitrogen oxide is unlikely to be generated in the base insulating film 102 or the gate insulating film 104, so that the carrier trap at the interface between the base insulating film 102 or the gate insulating film 104 and the oxide semiconductor film can be inhibited. Furthermore, a shift in the threshold voltage of the transistor included in the semiconductor device can be inhibited, which leads to a reduced change in the electrical characteristics of the transistor.

The base insulating film 102 and the gate insulating film 104 each preferably include a portion in which the hydrogen concentration measured by SIMS is lower than $5 \times 10^{20}$ atoms/cm$^3$. Low hydrogen concentrations of the base insulating film 102 and the gate insulating film 104 can prevent hydrogen from entering the oxide semiconductor film.

There is no particular limitation on a material and the like of the substrate 100 as long as the material has heat resistance high enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used as the substrate 100.

Alternatively, a flexible substrate may be used as the substrate 100, and the transistor 150 may be provided directly on the flexible substrate. Alternatively, a separation layer may be provided between the substrate 100 and the transistor 150. The separation layer can be used when part or the whole of a semiconductor device formed over the separation layer is completed, separated from the substrate 100, and transferred to another substrate. In such a case, the transistor 150 can be transferred to a substrate having low heat resistance or a flexible substrate as well.

Examples of the base insulating film 102 include a silicon oxide film, a silicon oxynitride film, a silicon nitride film, a silicon nitride oxide film, a gallium oxide film, a hafnium oxide film, a yttrium oxide film, an aluminum oxide film, an aluminum oxynitride film, and the like. Note that when the above film is used as the base insulating film, it is possible to suppress diffusion of impurities such as an alkali metal, water, and hydrogen from the substrate 100 side into the oxide semiconductor film.

In the case where the base insulating film 102 is formed using an oxide insulating film containing nitrogen and having a small number of defects, the gate insulating film 104 can be formed to have a single-layer structure or a stacked-layer structure using, for example, any of silicon oxide, silicon oxynitride, silicon nitride oxide, silicon nitride, aluminum oxide, hafnium oxide, gallium oxide, a Ga—Zn-based metal oxide, and the like. Note that an oxide insulating film is preferably used for at least a region of the gate insulating film 104, which is positioned near the oxide semiconductor film, in order to improve characteristics of the interface with the oxide semiconductor film.

Furthermore, it is possible to prevent outward diffusion of oxygen from the oxide semiconductor film and entry of hydrogen, water, and the like into the oxide semiconductor film from the outside by providing an insulating film having a blocking effect against oxygen, hydrogen, water, and the like as the gate insulating film 104. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 104 may be formed using a high-k material such as hafnium silicate (HfSi$_x$O$_y$), hafnium silicate (HfSi$_x$O$_y$) to which nitrogen is added, hafnium aluminate (HfAl$_x$O$_y$) to which nitrogen is added, hafnium oxide, or yttrium oxide, so that gate leakage current of the transistor can be reduced.

The oxide semiconductor film (each of the oxide semiconductor films 101*a* and 101*b*) is formed using a metal oxide containing at least In or Zn; as a typical example, an In—Ga oxide, an In—Zn oxide, an In—Mg oxide, a Zn—Mg oxide, or an In-M-Zn oxide (M represents Al, Ti, Ga, Ge, Y, Zr, Sn, La, Ce, Mg, Nd, or Hf) can be given.

Note that in the case where the oxide semiconductor film contains an In-M-Zn oxide, the proportions of In and M, not taking Zn and O into consideration, are preferably as follows: the proportion of In is greater than 25 atomic % and the proportion of M is less than 75 atomic %, or further preferably, the proportion of In is greater than 34 atomic % and the proportion of M is less than 66 atomic %.

The energy gap of the oxide semiconductor film is 2 eV or more, preferably 2.5 eV or more, further preferably 3 eV or more. With the use of an oxide semiconductor having such a wide energy gap, the off-state current of the transistor 150 can be reduced.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film contains an In-M-Zn oxide (M represents Al, Ga, Y, Zr, La, Ce, Mg, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, or In:M:Zn=4:2:3 is preferable. Note that the atomic ratios of metal elements in the formed oxide semiconductor film vary from the above atomic ratio of metal elements of the sputtering target within a range of ±40% as an error.

Hydrogen contained in the oxide semiconductor film reacts with oxygen bonded to a metal atom to form water, and in addition, an oxygen vacancy is formed in a lattice from which oxygen is released (or in a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen as well as the oxygen vacancies be reduced as much as possible in the oxide semiconductor film. Specifically, the oxide semiconductor film has a portion in which the hydrogen concentration that is measured by SIMS is $2\times10^{20}$ atoms/cm$^3$ or lower, preferably $5\times10^{19}$ atoms/cm$^3$ or lower, further preferably $1\times10^{19}$ atoms/cm$^3$ or lower, still further preferably $5\times10^{18}$ atoms/cm$^3$ or lower, yet still further preferably $1\times10^{18}$ atoms/cm$^3$ or lower, yet still further preferably $5\times10^{17}$ atoms/cm$^3$ or lower, yet still further preferably $1\times10^{16}$ atoms/cm$^3$ or lower. As a result, the transistor 150 has positive threshold voltage (normally-off characteristics).

When silicon or carbon that is one of elements belonging to Group 14 is contained in the oxide semiconductor film, oxygen vacancies are increased in the oxide semiconductor film, and the oxide semiconductor film becomes an n-type film. Thus, the oxide semiconductor film has a portion in which the concentration of silicon or carbon (the concentration is measured by SIMS) is lower than or equal to $2\times10^{18}$ atoms/cm$^3$, preferably lower than or equal to $2\times10^{17}$ atoms/cm$^3$. As a result, the transistor 150 has normally-off characteristics.

Furthermore, the oxide semiconductor film has a portion in which the concentration of alkali metal or alkaline earth metal, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film. As a result, the transistor 150 has normally-off characteristics.

Furthermore, when containing nitrogen, the oxide semiconductor film easily becomes an n-type film by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible. For example, the oxide semiconductor film preferably has a portion in which the concentration of nitrogen, which is measured by SIMS, is lower than or equal to $5\times10^{18}$ atoms/cm$^3$.

When impurities in the oxide semiconductor film are reduced, the carrier density of the oxide semiconductor film can be lowered. The oxide semiconductor film preferably has a portion with a carrier density of $1\times10^{17}$/cm$^3$ or lower, further preferably $1\times10^{15}$/cm$^3$ or lower, still further preferably $1\times10^{13}$/cm$^3$ or lower, yet still further preferably $1\times10^{11}$/cm$^3$ or lower.

An oxide semiconductor film in which the impurity concentration is low and the density of defect states is low can be used as the oxide semiconductor film, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have normally-off characteristics. A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor film may have a non-single-crystal structure, for example. Non-single-crystal structures include a c-axis aligned crystalline oxide semiconductor (CAAC-OS) described later, a polycrystalline structure, a microcrystalline structure described later, and an amorphous structure. Among the non-single-crystal structures, the amorphous structure has the highest density of defect states, whereas the CAAC-OS has the lowest density of defect states.

Note that the oxide semiconductor film may be a mixed film including two or more of the following: a region having an amorphous structure, a region having a microcrystalline structure, a region having a polycrystalline structure, a CAAC-OS region, and a region having a single crystal structure. The mixed film has a single-layer structure including, for example, two or more of a region having an amorphous structure, a region having a microcrystalline structure, a region having a polycrystalline structure, a CAAC-OS region, and a region having a single crystal structure in some cases. Furthermore, the mixed film has a stacked-layer structure including, for example, layers of two or more of a region having an amorphous structure, a region having a microcrystalline structure, a region having a polycrystalline structure, a CAAC-OS region, and a region having a single crystal structure in some cases.

Here, a mixed region of the oxide semiconductor film 101*a* and the oxide semiconductor film 101*b* might exist between the oxide semiconductor film 101*a* and the oxide semiconductor film 101*b*. Further, a mixed region of the oxide semiconductor film 101*b* and the metal oxide film 111 might exist between the oxide semiconductor film 101*b* and the metal oxide film 111. The mixed region has a low density of interface states. For that reason, the stack including the oxide semiconductor films 101*a* and 101*b* and the metal oxide film 111 has a band structure where energy at each interface and in the vicinity of the interface is changed continuously (continuous junction).

Here, a band structure is described. For easy understanding, the band structure is illustrated with the energy (Ec) at the bottom of the conduction band of each of the base insulating film 102, the oxide semiconductor film 101*a*, the oxide semiconductor film 101*b*, the metal oxide film 111, and the gate insulating film 104.

Figure 11A:
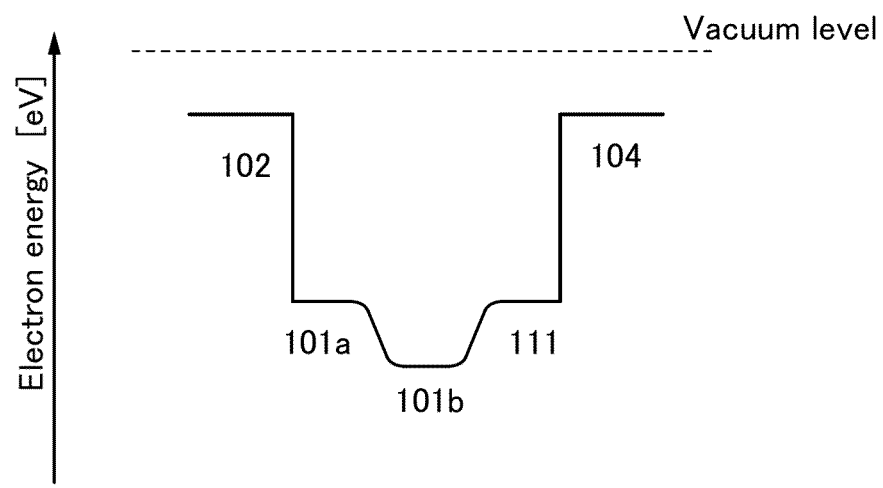
FIGS. 11A and 11B each illustrate a band structure of a transistor.
Figure 11B:
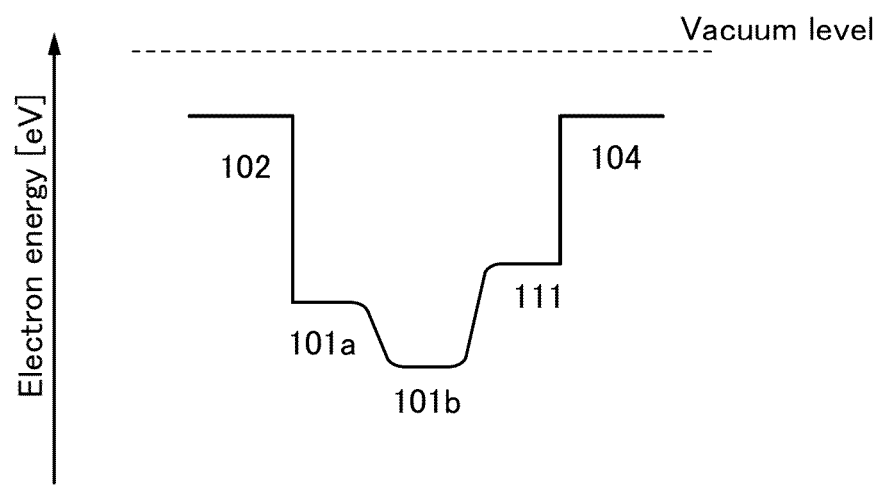

As illustrated in FIGS. 11A and 11B, the energy at the bottom of the conduction band changes continuously in the oxide semiconductor film 101*a*, the oxide semiconductor film 101*b*, and the metal oxide film 111. This can be understood also from the fact that the constituent elements are common among the oxide semiconductor film 101*a*, the oxide semiconductor film 101*b*, and the metal oxide film 111 and oxygen is easily diffused among the oxide semiconductor films 101*a* and 101*b* and the metal oxide film 111. Thus, the oxide semiconductor films 101*a* and 101*b* and the metal oxide film 111 have a continuous physical property although they are a stack of layers having different compositions.

The oxide semiconductor (or metal oxide) films, which contain the same main components and are stacked, are not simply stacked but formed to have continuous junction (here, particularly a U-shaped well structure where the energy at the bottom of the conduction band is continuously changed between the films). In other words, a stacked-layer structure is formed such that there exist no impurities which form a defect level such as a trap center or a recombination center in an oxide semiconductor at each interface. If impurities are mixed between the films in the stacked multilayer film, the continuity of the energy band is lost and carriers disappear by being trapped or recombined at the interface.

Note that FIG. 11A illustrates the case where the Ec of the oxide semiconductor film 101a and the Ec of the metal oxide film 111 are equal to each other; however, they may be different from each other. For example, part of the band structure in the case where the Ec of the metal oxide film 111 is higher than the Ec of the oxide semiconductor film 101a is illustrated in FIG. 11B.

As illustrated in FIGS. 11A and 11B, the oxide semiconductor film 101b serves as a well and a channel of the transistor 150 is formed in the oxide semiconductor film 101b. Note that since the energies at the bottoms of the conduction bands are changed continuously, the oxide semiconductor films 101a and 101b and the metal oxide film 111 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the oxide semiconductor film 101a and the metal oxide film 111. The oxide semiconductor film 101b can be distanced away from the trap levels owing to existence of the oxide semiconductor film 101a and the metal oxide film 111. However, when the energy difference between the Ec of the oxide semiconductor film 101a or the metal oxide film 111 and the Ec of the oxide semiconductor film 101b is small, an electron in the oxide semiconductor film 101b might reach the trap level across the energy difference. When the electron is trapped in the trap level, a negative fixed charge is generated at the interface with the insulating film, whereby the threshold voltage of the transistor is shifted in the positive direction.

Thus, to reduce a change in the threshold voltage of the transistor, an energy difference between the Ec of the oxide semiconductor film 101b and the Ec of each of the oxide semiconductor film 101a and the metal oxide film 111 is necessary. The energy difference is preferably greater than or equal to 0.1 eV, further preferably greater than or equal to 0.15 eV.

The oxide semiconductor films 101a and 101b and the metal oxide film 111 preferably include crystal parts. In particular, when a crystal in which c-axes are aligned is used, the transistor can have stable electrical characteristics.

For the oxide semiconductor film 101b, an oxide having an electron affinity higher than that of each of the oxide semiconductor film 101a and the metal oxide film 111 is used. For example, for the oxide semiconductor film 101b, an oxide having an electron affinity higher than that of each of the oxide semiconductor film 101a and the metal oxide film 111 by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

For example, when an In—Ga—Zn oxide is used for the oxide semiconductor films 101a and 101b, a material whose atomic ratio of In to Ga and Zn is any of 1:1:1, 2:2:1, 3:1:2, 1:3:2, 1:3:4, 1:4:3, 1:5:4, 1:6:6, 2:1:3, 1:6:4, 1:9:6, 1:1:4, 1:1:2, and 4:2:4.1 is used so that the oxide semiconductor film 101a has an electron affinity lower than that of the oxide semiconductor film 101b.

When an electric field is applied to the gate electrode at this time, the channel is formed in the oxide semiconductor film 101b that has the highest electron affinity among the oxide semiconductor films 101a and 101b and the metal oxide film 111.

The source electrode 103a and the drain electrode 103b can have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. A transparent conductive material containing indium oxide, tin oxide, or zinc oxide may be used.

The gate electrode 105 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 105 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are contained may be used.

The gate electrode 105 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, indium tin oxide containing silicon oxide, an indium oxide compound containing magnesium oxide, zinc oxide containing gallium oxide, zinc oxide containing aluminum oxide, zinc oxide containing magnesium oxide, or tin oxide containing fluorine. It is also possible to employ a stacked-layer structure formed using the above light-transmitting conductive material and the above metal element.

The insulating film 107 serves as a barrier film that blocks oxygen, hydrogen, water, and the like. This means that the insulating film 107 can prevent hydrogen and water from entering the oxide semiconductor film 101b from the outside and can prevent oxygen in the oxide semiconductor film 101b from being released to the outside. Note that it is preferable that hydrogen, water, and the like in the insulating film 107 be reduced as much as possible. It is preferable that the release of hydrogen, water, and the like be reduced as much as possible.

Furthermore, it is possible to prevent outward diffusion of oxygen from the oxide semiconductor film and entry of hydrogen, water, and the like into the oxide semiconductor film from the outside by providing an insulating film having a blocking effect against oxygen, hydrogen, water, and the like as the insulating film 107. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The thickness of the insulating film 107 is preferably greater than or equal to 150 nm and less than or equal to 400 nm.

Next, a method for manufacturing the transistor 150 illustrated in FIGS. 1A to 1C will be described with reference to FIGS. 2A to 2C and FIGS. 3A to 3C. A cross section in the channel length direction along dashed-dotted line A1-A2 in FIG. 1A and a cross section in the channel width direction along dashed-dotted line B1-B2 in FIG. 1A are used in FIGS. 2A to 2C and FIGS. 3A to 3C to describe the method for manufacturing the transistor 150.

Films included in the transistor 150 (i.e., an insulating film, an oxide semiconductor film, a metal oxide film, a conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method is performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves).

In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute transistor.

Figure 2A:
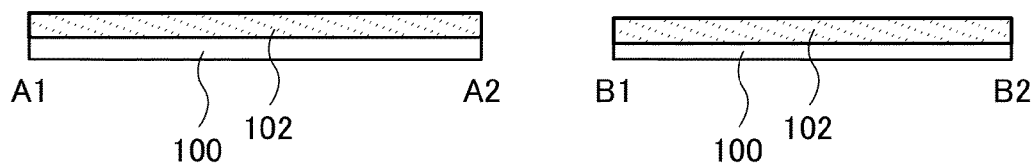
FIGS. 2A to 2C illustrate a method for manufacturing a transistor.

First, the base insulating film 102 is formed over the substrate 100 (see FIG. 2A).

As the substrate 100, for example, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used.

The base insulating film 102 can be formed by a plasma CVD method, a sputtering method, or the like using an oxide insulating film such as an aluminum oxide film, a magnesium oxide film, a silicon oxide film, a silicon oxynitride film, a gallium oxide film, a germanium oxide film, an yttrium oxide film, a zirconium oxide film, a lanthanum oxide film, a neodymium oxide film, a hafnium oxide film, a tantalum oxide film, or the like; a nitride insulating film such as a silicon nitride film, a silicon nitride oxide film, an aluminum nitride film, an aluminum nitride oxide film, or the like; or a mixed material of any of these. Alternatively, a stack including any of the above materials may be used, and at least an upper layer which is in contact with the oxide semiconductor film is preferably formed using a material containing excess oxygen that might serve as a supply source of oxygen to the oxide semiconductor film by heat treatment or the like.

Oxygen may be added to the base insulating film 102 by an ion implantation method, an ion doping method, a plasma immersion ion implantation method, or the like. Adding oxygen enables the base insulating film 102 to supply oxygen much easily to the oxide semiconductor film. Oxygen may be directly added to the oxide semiconductor film 101a or the like by an ion implantation method, an ion doping method, a plasma immersion ion implantation method, or the like.

In the case where a silicon oxide film or a silicon oxynitride film is formed as the base insulating film 102, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

In the case where a gallium oxide film is formed as the base insulating film 102, an MOCVD method can be used.

In the case where a hafnium oxide film is formed as the base insulating film 102 by a thermal CVD method such as an MOCVD method or an ALD method, two kinds of gases, i.e., ozone ($O_3$) as an oxidizer and a source material gas which is obtained by vaporizing a liquid containing a solvent and a hafnium precursor compound (a hafnium alkoxide or a hafnium amide such as tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide) hafnium.

In the case where an aluminum oxide film is formed as the base insulating film 102 by a thermal CVD method such as an MOCVD method or an ALD method, two kinds of gases, i.e., $H_2O$ as an oxidizer and a source material gas which is obtained by vaporizing a liquid containing a solvent and an aluminum precursor compound (e.g., trimethylaluminum (TMA)), are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the base insulating film 102 by a thermal CVD method such as an MOCVD method or an ALD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

Here, a silicon oxynitride film is formed as the base insulating film 102 by a PECVD method.

In the case where a surface of the substrate 100 is made of an insulator and there is no influence of impurity diffusion into the oxide semiconductor film to be formed later, the base insulating film 102 is not necessarily provided.

Figure 2B:
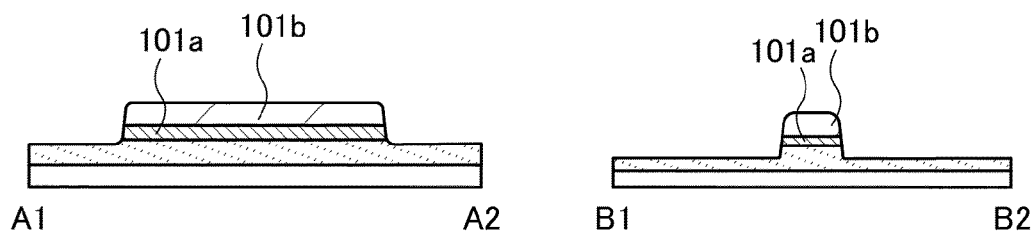

Next, the oxide semiconductor films 101a and 101b are formed over the base insulating film 102 by a sputtering method, a CVD method, an MBE method, an ALD method, a PLD method, or the like (see FIG. 2B). At this time, as shown in the drawing, the base insulating film 102 can be slightly overetched. By overetching of the base insulating film 102, the gate electrode 105 to be formed later can cover the oxide semiconductor film 101b easily.

For processing the oxide semiconductor films 101a and 101b into island shapes, first, a film to be a hard mask (e.g., a tungsten film) and a resist mask are provided over the oxide semiconductor film 101b, and the film to be a hard mask is etched to form a hard mask. Then, the resist mask is removed and the oxide semiconductor films 101a and 101b are etched by using the hard mask as a mask. After that, the hard mask is removed. At the time of the etching, the hard mask is gradually reduced as the etching progresses; as a result, end portions of the hard mask may be rounded to have curved surfaces in some cases. Accordingly, end portions of the oxide semiconductor film 101b may also be rounded to have curved surfaces in some cases. With this structure, the coverage with the metal oxide film 111, the gate insulating film 104, the gate electrode 105, and the insulating film 107, which are to be formed over the oxide semiconductor film 101b, can be improved; thus, a shape defect such as disconnection can be inhibited.

In order to form a continuous energy band in a stack including the oxide semiconductor films 101a and 101b, or a stack including the oxide semiconductor film 101a, the oxide semiconductor film 101b, and the metal oxide film 111 which is to be formed in a later step, the layers need to be formed successively without exposure to the air with the use of a multichamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities in an oxide semiconductor are removed as much as possible. Alternatively, a combination of a turbo molecular pump and a cold trap is preferably used to prevent back-flow of a gas containing a carbon component, moisture, or the like from an exhaust system into the chamber.

To obtain a highly purified intrinsic oxide semiconductor, not only high vacuum evacuation of the chamber but also purification of a sputtering gas is necessary. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, a transistor including an oxide semiconductor film having high impurity concentration and a high density of defect states has unstable electrical characteristics in some cases.

The materials described above can be used for the oxide semiconductor films 101a and 101b. For example, an In—Ga—Zn oxide whose atomic ratio of In to Ga and Zn is 1:3:4 or 1:3:2 can be used for the oxide semiconductor film 101a. An In—Ga—Zn oxide whose atomic ratio of In to Ga and Zn is 1:1:1 can be used for the oxide semiconductor film 101b.

An oxide that can be used for the oxide semiconductor films 101a and 101b preferably contains at least indium (In) or zinc (Zn). Both In and Zn are preferably contained. In order to reduce fluctuations in electrical characteristics of the transistor including the oxide semiconductor, the oxide semiconductor preferably contains a stabilizer in addition to In and Zn.

Examples of the stabilizer include gallium (Ga), tin (Sn), hafnium (Hf), aluminum (Al), zirconium (Zr), and the like. Other examples of the stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide, an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Fe, Mn, and Co. Alternatively, a material represented by $In_2SnO_5(ZnO)_n$ (n>0, where n is an integer) may be used.

The material of the oxide semiconductor film 101a is selected so that the oxide semiconductor film 101a has a lower electron affinity than the oxide semiconductor film 101b.

Note that the oxide semiconductor films are preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

As a sputtering gas, a rare gas (typically argon), oxygen, or a mixed gas of a rare gas and oxygen is used as appropriate. In the case of using the mixed gas of a rare gas and oxygen, the proportion of oxygen to the rare gas is preferably increased.

Furthermore, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., the oxide semiconductor film can be a CAAC-OS film.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, preferably, the proportion of oxygen in the sputtering gas is increased and the power is optimized in order to reduce plasma damage at the deposition. The proportion of oxygen in the sputtering gas is 30 vol % or higher, preferably 100 vol %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed in an inert gas atmosphere containing nitrogen or a rare gas such as helium, neon, argon, xenon, or krypton. Furthermore, the heat treatment may be performed in an inert gas atmosphere first, and then in an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the oxide semiconductor film can have a portion in which the hydrogen concentration is $2\times10^{20}$ atoms/cm$^3$ or lower, preferably $5\times10^{19}$ atoms/cm$^3$ or lower, further preferably $1\times10^{19}$ atoms/cm$^3$ or lower, still further preferably $5\times10^{18}$ atoms/cm$^3$ or lower, yet still further preferably $1\times10^{18}$ atoms/cm$^3$ or lower, yet still further preferably $5\times10^{17}$ atoms/cm$^3$ or lower, yet still further preferably $1\times10^{16}$ atoms/cm$^3$ or lower.

For example, in the case where an oxide semiconductor film, e.g., an $InGaZnO_X$ (X>0) film is formed using a deposition apparatus employing an ALD method, an $In(CH_3)_3$ gas and an $O_3$ gas are sequentially introduced two or more times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is bubbled with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Here, an oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen, whereby the oxide semiconductor film is formed.

When the heat treatment is performed at temperatures higher than 350° C. and lower than or equal to 650° C., preferably higher than or equal to 450° C. and lower than or equal to 600° C., it is possible to obtain an oxide semiconductor film whose proportion of CAAC is greater than or equal to 60%, preferably greater than or equal to 80%, further preferably greater than or equal to 90%, still further preferably greater than or equal to 95%. Furthermore, it is possible to obtain an oxide semiconductor film having a low content of hydrogen, water, and the like. This means that an oxide semiconductor film with a low impurity concentration and a low density of defect states can be formed. Note that even when the oxide semiconductor film is a CAAC-OS film, a diffraction pattern similar to that of an nc-OS film or the like is partly observed in some cases. The proportion of a region where a diffraction pattern of a CAAC-OS film is observed in a predetermined area is defined as the proportion of CAAC.

Figure 2C:
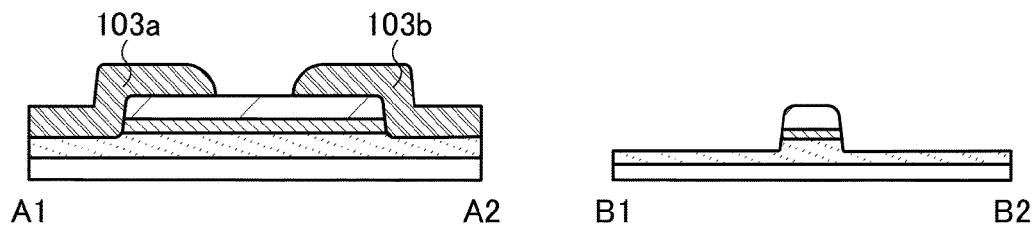

Next, the source electrode 103a and the drain electrode 103b are formed so as to be in contact with the oxide semiconductor film 101b (see FIG. 2C).

Figure 3A:
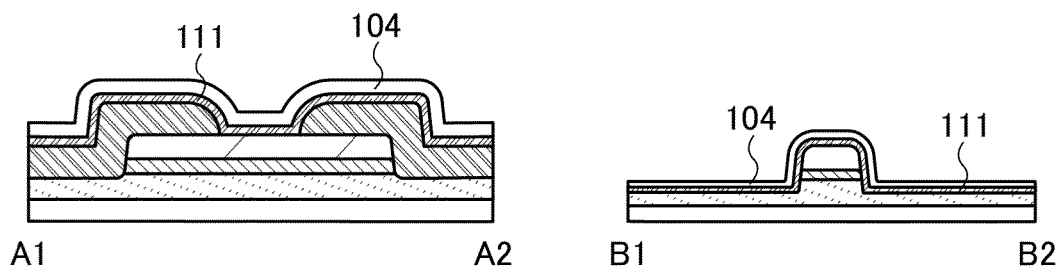
FIGS. 3A to 3C illustrate a method for manufacturing a transistor.

Next, the metal oxide film 111 is formed over the oxide semiconductor film 101b, the source electrode 103a, and the drain electrode 103b, and the gate insulating film 104 is formed over the metal oxide film 111 (see FIG. 3A).

The metal oxide film 111 is formed by a sputtering method, an ALD method, an MOCVD method, or the like.

Note that after the metal oxide film 111 is formed, heat treatment may be performed. The heat treatment can remove impurities such as hydrogen and water from the metal oxide film 111. In addition, impurities such as hydrogen and water can be further removed from the oxide semiconductor films 101a and 101b.

Figure 3B:
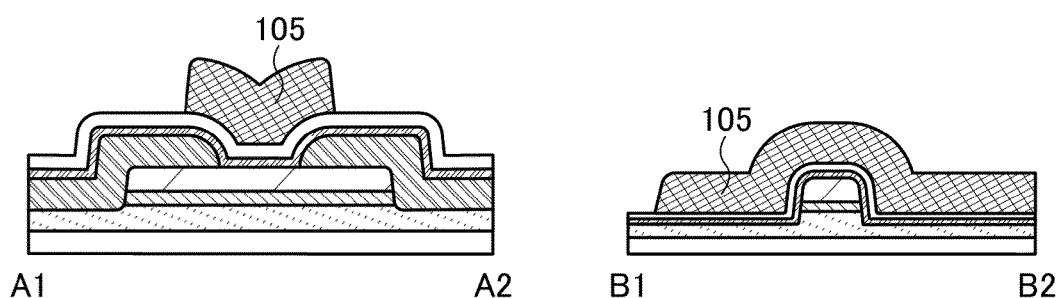

Next, the gate electrode 105 is formed so as to overlap with the oxide semiconductor film 101b with the gate insulating film 104 provided therebetween (see FIG. 3B).

Figure 3C:
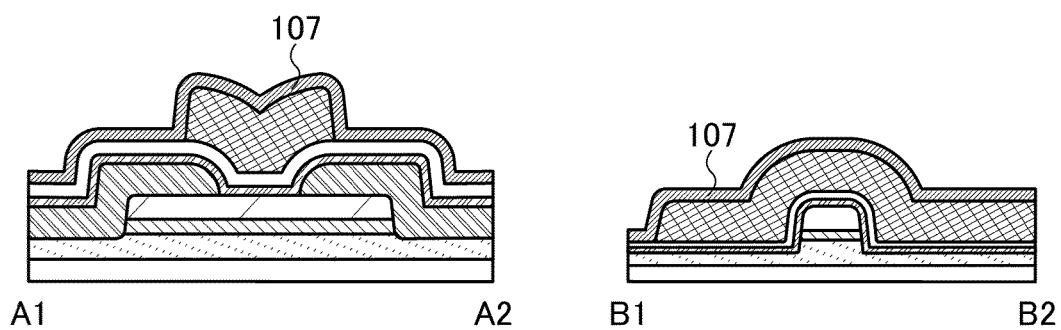

Next, the insulating film 107 is formed over the gate insulating film 104 and the gate electrode 105 (see FIG. 3C).

The insulating film 107 is preferably formed by an ALD method. Owing to good coverage, a film formed by an ALD method can favorably cover a large step portion (such as a step formed by the gate electrode 105 and the gate insulating film 104) and can stabilize the characteristics of the transistor 150.

Through the above steps, the transistor 150 can be manufactured.

Modification Example 1

Figure 4A:
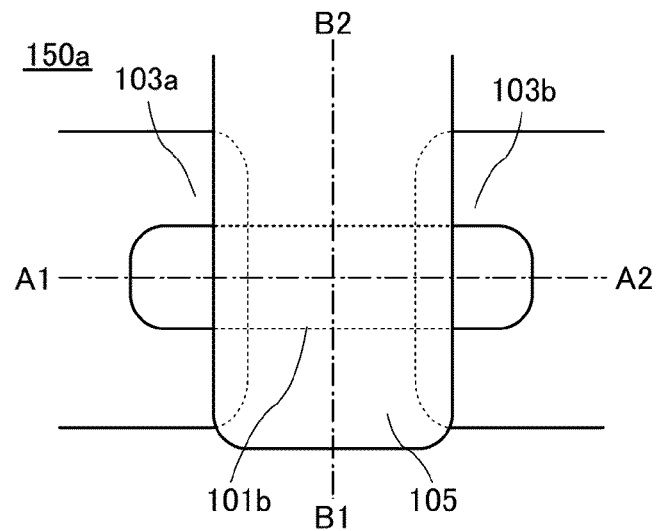
FIGS. 4A to 4C are a top view and cross-sectional views illustrating a transistor.
Figure 4B:
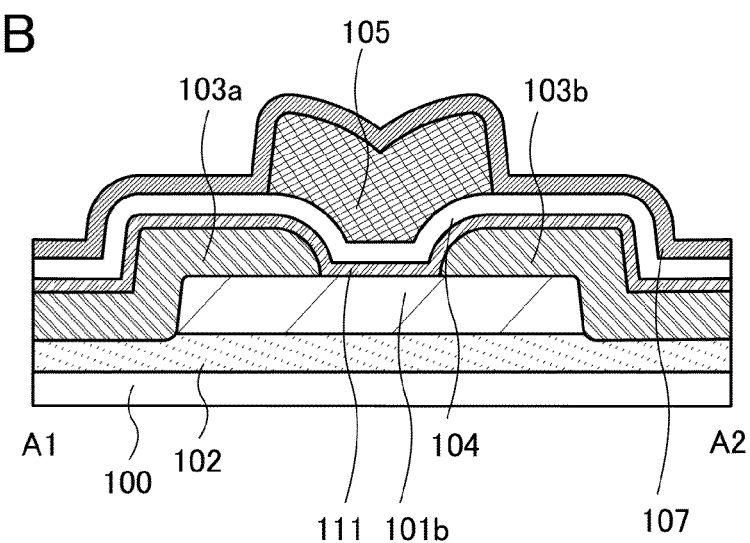
Figure 4C:
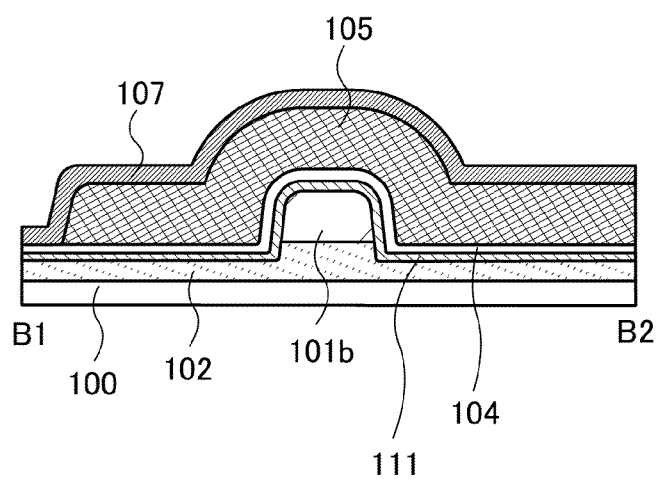

Although the transistor 150 described in Embodiment 1 includes the two oxide semiconductor films, the present invention is not limited to this example. There may be a single oxide semiconductor film or three or more oxide semiconductor films. FIGS. 4A to 4C illustrate a case of a single oxide semiconductor film, and FIGS. 5A to 5C illustrate a case of three oxide semiconductor films.

FIGS. 4A to 4C are a top view and cross-sectional views illustrating a transistor 150a included in a semiconductor device. FIG. 4A is a top view of the transistor 150a. FIG. 4B is a cross-sectional view taken along dashed-dotted line A1-A2 in FIG. 4A. FIG. 4C is a cross-sectional view taken along dashed-dotted line B1-B2 in FIG. 4A. In FIGS. 4A to 4C, some components are enlarged, reduced in size, or omitted for easy understanding.

Figure 5A:
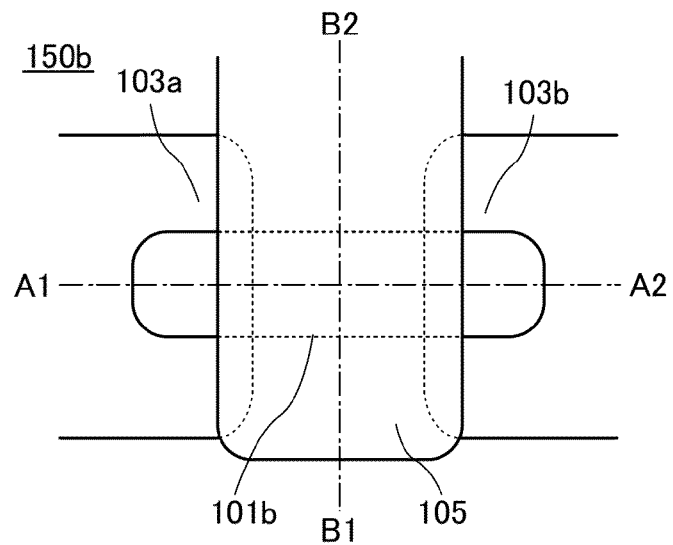
FIGS. 5A to 5C are a top view and cross-sectional views illustrating a transistor.
Figure 5B:
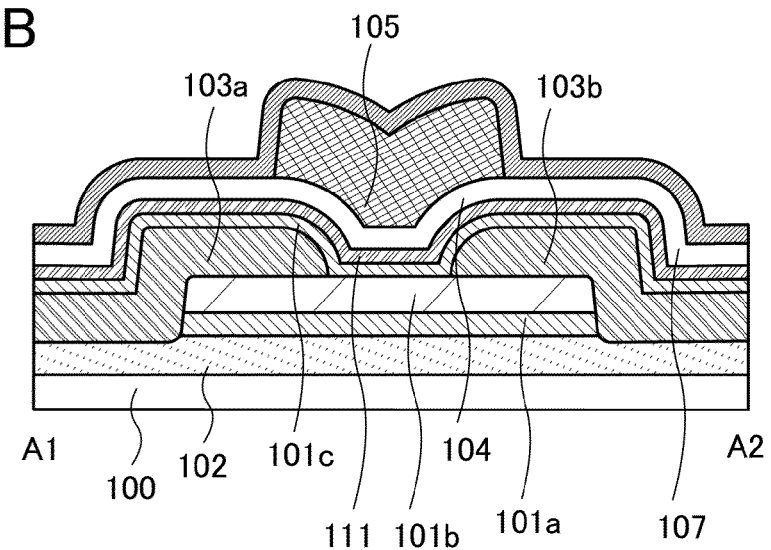
Figure 5C:
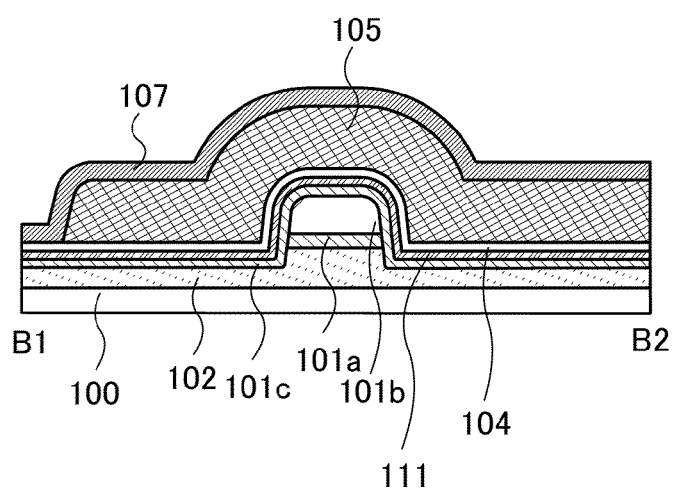

FIGS. 5A to 5C are a top view and cross-sectional views illustrating a transistor 150b included in a semiconductor device. FIG. 5A is a top view of the transistor 150b. FIG. 5B is a cross-sectional view taken along dashed-dotted line A1-A2 in FIG. 5A. FIG. 5C is a cross-sectional view taken along dashed-dotted line B1-B2 in FIG. 5A. In FIGS. 5A to 5C, some components are enlarged, reduced in size, or omitted for easy understanding.

Note that the description of the oxide semiconductor film 101a can be referred to for the material and the like of an oxide semiconductor film 101c.

Modification Example 2

Figure 6A:
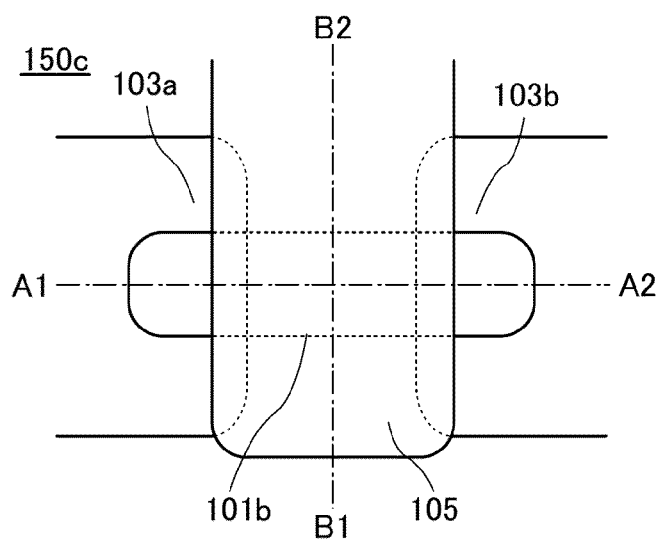
FIGS. 6A to 6C are a top view and cross-sectional views illustrating a transistor.
Figure 6B:
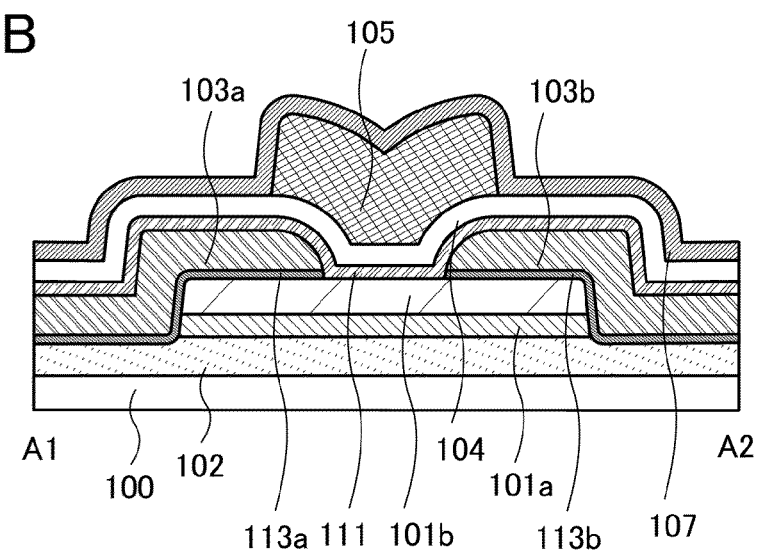
Figure 6C:
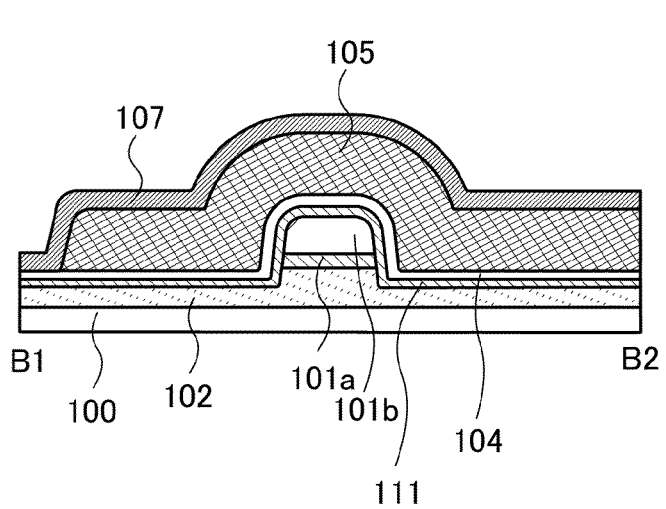

FIGS. 6A to 6C are a top view and cross-sectional views illustrating a transistor 150c included in a semiconductor device. FIG. 6A is a top view of the transistor 150c. FIG. 6B is a cross-sectional view taken along dashed-dotted line A1-A2 in FIG. 6A. FIG. 6C is a cross-sectional view taken along dashed-dotted line B1-B2 in FIG. 6A. In FIGS. 6A to 6C, some components are enlarged, reduced in size, or omitted for easy understanding. As in the structure illustrated in FIG. 6B, a side surface of the oxide semiconductor film 101b may be in contact with a layer 113a and a layer 113b.

The layers 113a and 113b may be formed using a transparent conductor, an oxide semiconductor, a nitride semiconductor, or an oxynitride semiconductor, for example. The layers 113a and 113b may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, any of these layers may contain hydrogen, carbon, nitrogen, silicon, germanium, or argon.

The layers 113a and 113b may have a property of transmitting visible light. Alternatively, the layers 113a and 113b may have a property of not transmitting visible light, ultraviolet light, infrared light, or X-rays by reflecting or absorbing it. In some cases, such a property can suppress a change in electrical characteristics of the transistor due to stray light.

The layers 113a and 113b may preferably be formed using a layer which does not form a Schottky barrier with the oxide semiconductor film 101b or the like. Accordingly, on-state characteristics of the transistor can be improved.

Note that the layers 113a and 113b may preferably be formed using a layer having a resistance higher than that of the source electrode 103a and the drain electrode 103b. The layers 113a and 113b may preferably be formed using a layer having a resistance lower than that of the channel of the transistor. For example, the layers 113a and 113b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 113a and 113b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 113a and 113b (e.g., the layer on the drain side) may preferably be provided.

Modification Example 3

Figure 7A:
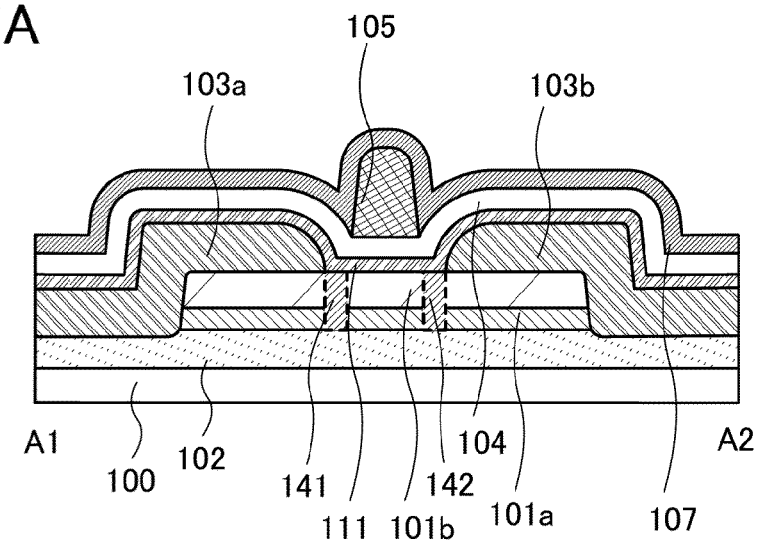
FIGS. 7A to 7C are cross-sectional views each illustrating a transistor.
Figure 7B:
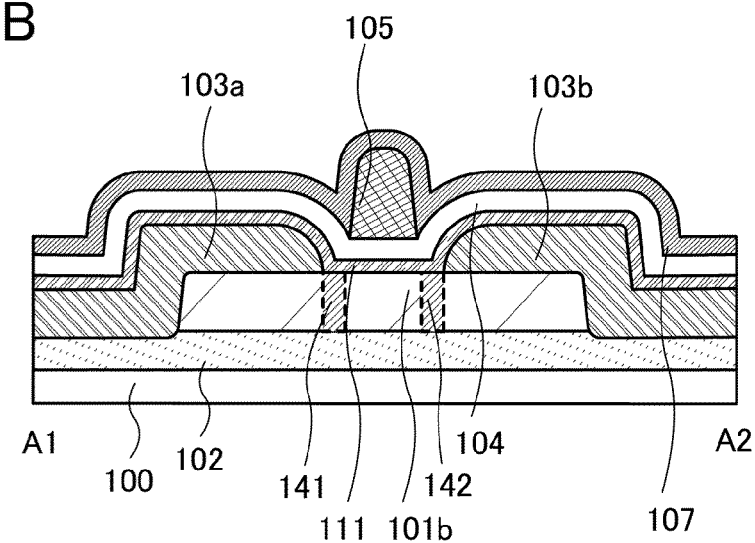
Figure 7C:
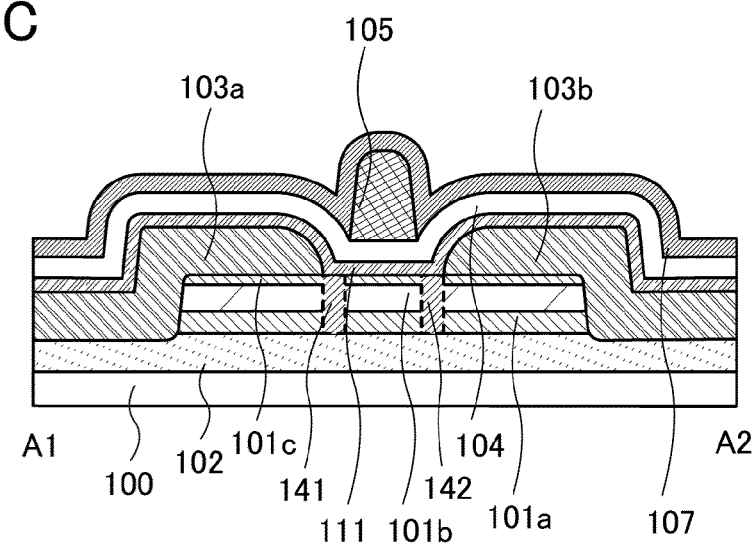

The above structures can each be a self-aligned structure in which the resistance of an offset region is reduced, as illustrated in FIG. 7A, FIG. 7B, or FIG. 7C.

An n-type low-resistance region 141 and an n-type low-resistance region 142 can be formed by adding an impurity using the gate electrode 105 as a mask. Examples of the method for adding the impurity include an ion implantation method, an ion doping method, and a plasma immersion ion implantation method.

An impurity such as hydrogen, helium, neon, argon, krypton, xenon, boron, nitrogen, phosphorus, or arsenic increases the conductivities of the oxide semiconductor films 101a, 101b, and 101c.

Figure 8A:
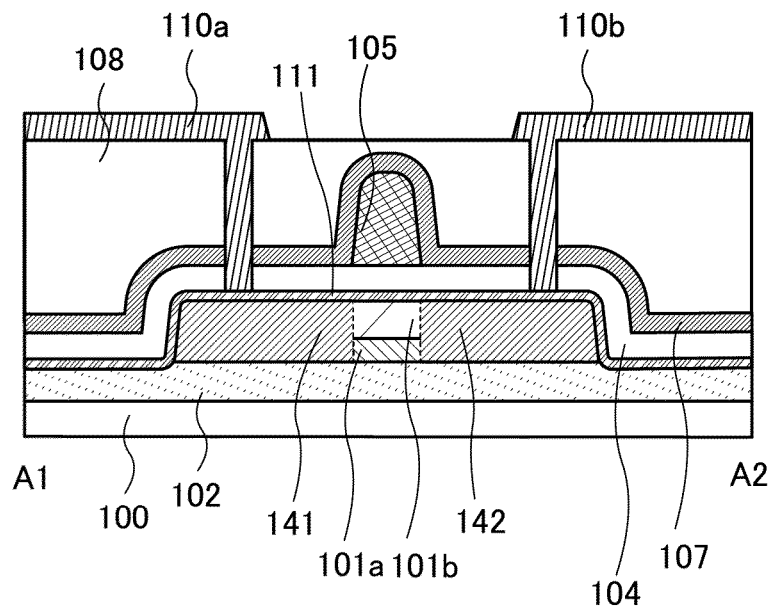
FIGS. 8A and 8B are cross-sectional views each illustrating a transistor.

Note that a self-aligned structure illustrated in FIG. 8A may also be employed. In this structure, the n-type low-resistance regions 141 and 142 serve as source and drain regions. The low-resistance regions 141 and 142 are electrically connected to a wiring 110a and a wiring 110b with an insulating film 108 provided therebetween.

The insulating film 108 has a function of an interlayer film, and an inorganic insulating film or an organic insulating film formed by a dry method or a wet method can be used. For example, it is possible to use a silicon nitride film, a silicon oxide film, a silicon oxynitride film, an aluminum oxide film, a tantalum oxide film, or the like, which is formed by a CVD method, a sputtering method, or the like. Alternatively, an organic material such as polyimide, acrylic, a benzocyclobutene-based resin, polyamide, or epoxy can be used. Other than such organic materials, a low dielectric constant material (a low-k material), a siloxane-based resin, phosphosilicate glass (PSG), borophosphosilicate glass (BPSG), or the like can be used.

The descriptions of the material and the like of the source electrode 103a and the drain electrode 103b can be referred to for the wiring 110a and the wiring 110b.

Figure 8B:
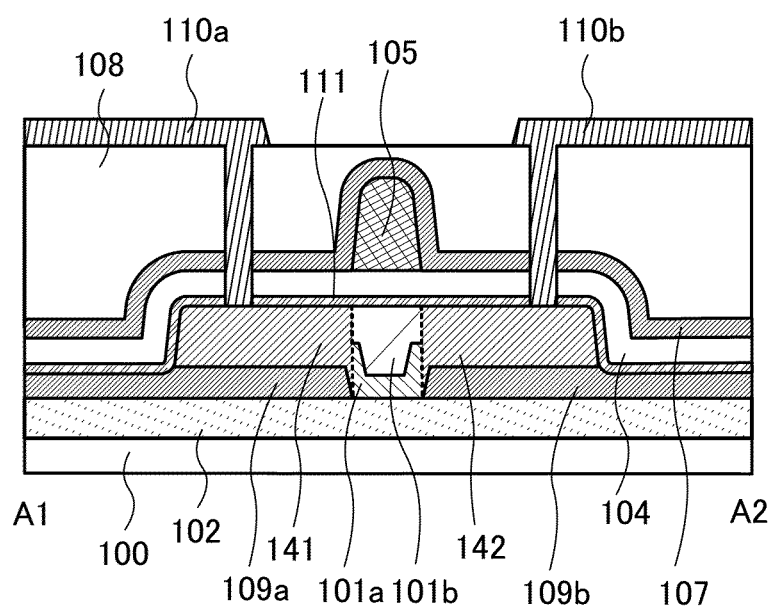

In the structure in FIG. 8A, the resistance of the n-type low-resistance regions 141 and 142 may be increased when oxygen is supplied thereto from the base insulating film 102. Therefore, it is preferable to provide an insulating film 109a and an insulating film 109b serving as barrier films between the base insulating film 102 and the low-resistance regions 141 and 142 as illustrated in FIG. 8B.

The insulating films 109a and 109b do not supply oxygen to the oxide semiconductor film at least by heat treatment or the like. Like the insulating film 107, the insulating films 109a and 109b function as barrier films and block oxygen, hydrogen, water, and the like.

The insulating films 109a and 109b can suppress oxygen supply from the base insulating film 102 to the low-resistance regions 141 and 142 and can suppress an increase in resistance of the low-resistance regions 141 and 142.

The descriptions of the material and the like of the insulating film 107 can be referred to for the insulating films 109a and 109b. The insulating films 109a and 109b are preferably formed by an ALD method.

Figure 9A:
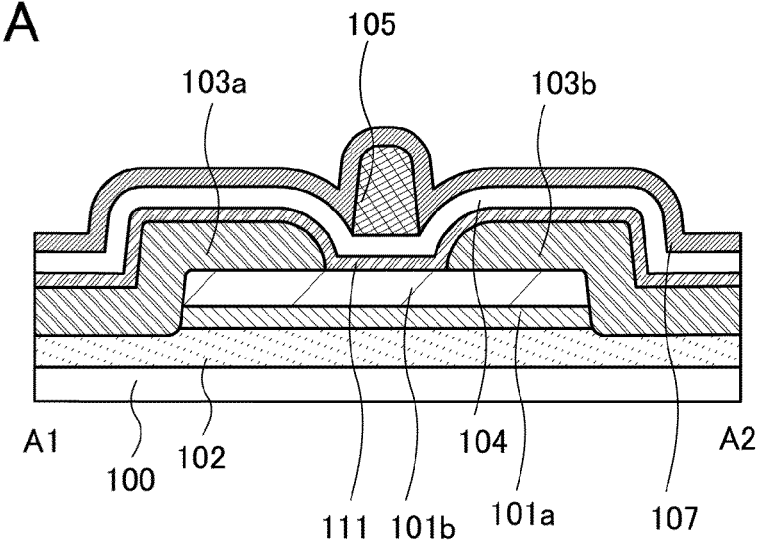
FIGS. 9A to 9C are cross-sectional views each illustrating a transistor.
Figure 9B:
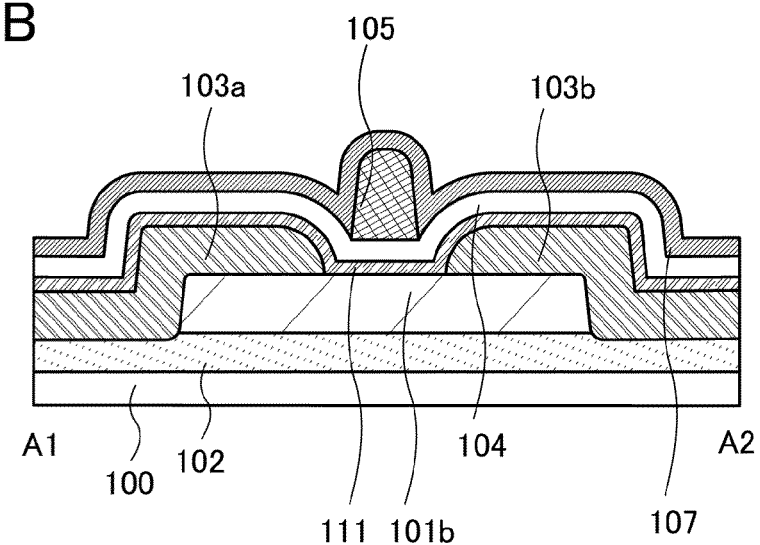
Figure 9C:
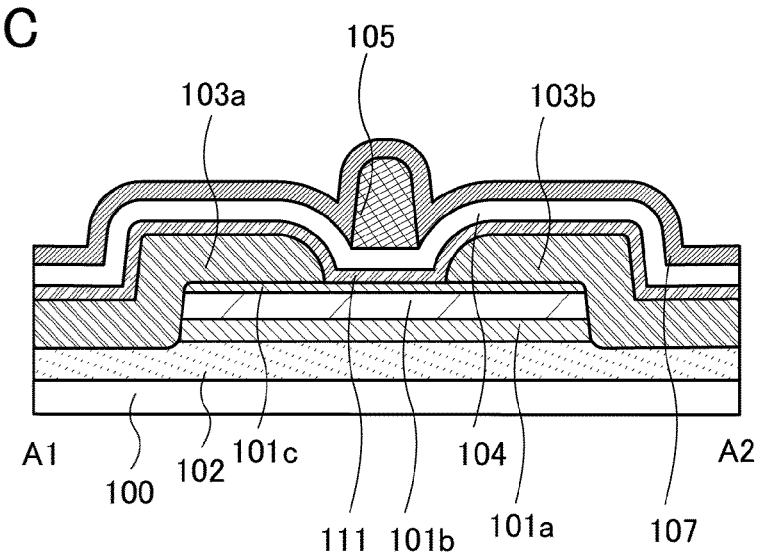

Note that the addition of the impurity with the use of the gate electrode 105 as a mask is not necessarily performed. Examples in that case are illustrated in FIGS. 9A to 9C. Although end portions of the gate electrode 105 are not aligned with end portions of the source electrode 103a and the drain electrode 103b in FIGS. 9A to 9C, one embodiment of the present invention is not limited thereto, and the end portions of the gate electrode 105 may be aligned with the end portions of the source electrode 103a and the drain electrode 103b.

Modification Example 4

Figure 10A:
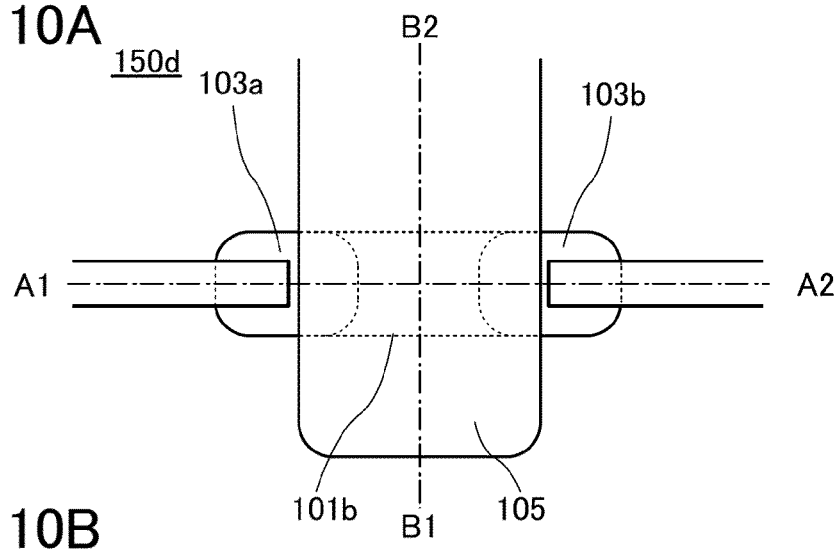
FIGS. 10A to 10C are a top view and cross-sectional views illustrating a transistor.
Figure 10B:
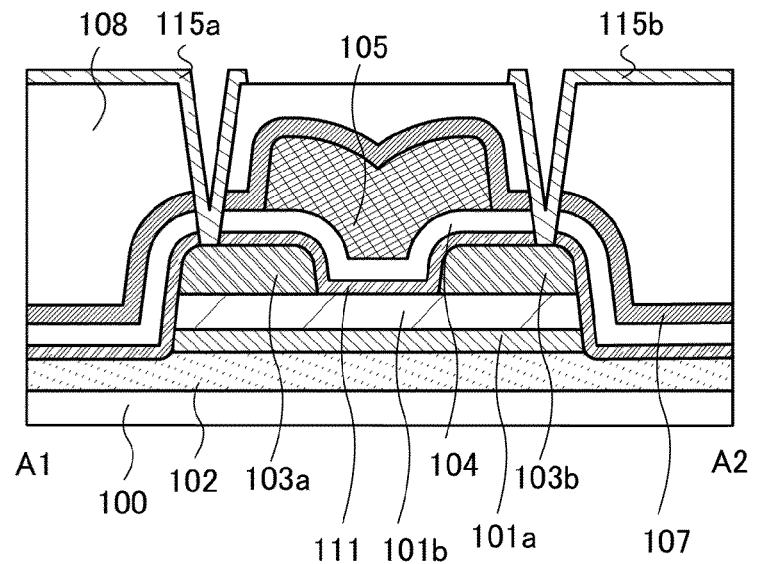
Figure 10C:
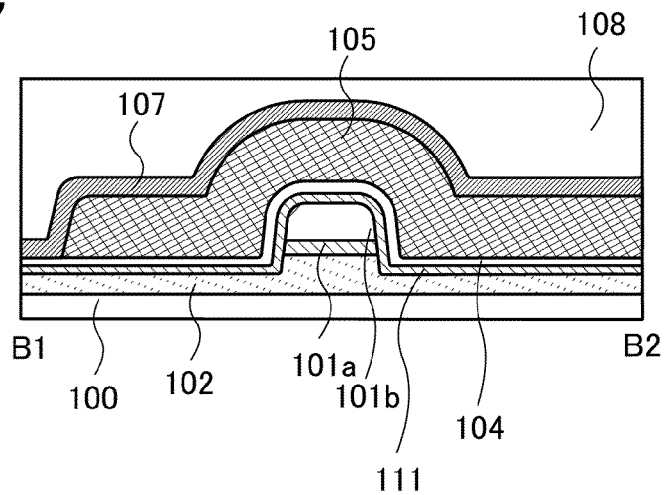

As in a structure of a transistor 150d illustrated in FIGS. 10A to 10C, the source electrode 103a and the drain electrode 103b may be provided in contact with and only over the oxide semiconductor film 101b.

Note that the source electrode 103a and the drain electrode 103b may be formed by processing a film serving as a hard mask used when the oxide semiconductor films 101a and 101b are etched.

A wiring 115a is electrically connected to the source electrode 103a through an opening provided in the insulating film 108. A wiring 115b is electrically connected to the drain electrode 103b through an opening provided in the insulating film 108. Note that the descriptions of the source electrode 103a and the drain electrode 103b can be referred to for the material and the like of the wiring 115a and the wiring 115b.

Note that the structures, methods, and the like described in this embodiment can be used as appropriate in combination with any of the structures, methods, and the like described in other embodiments and examples.

Embodiment 2

In this embodiment, one embodiment which can be applied to the oxide semiconductor film in the transistor included in the semiconductor device described in the above embodiment will be described.

An oxide semiconductor film is classified roughly into a non-single-crystal oxide semiconductor film and a single crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, a transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be observed. Furthermore, in the high-resolution TEM image, there are a region where a crystal part is clearly observed and a region where a crystal part is not observed. In some cases, growth of the crystal part occurs due to the crystallization of the amorphous-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Note that an oxide semiconductor film may be a stacked film including two or more films of an amorphous oxide semiconductor film, an amorphous-like OS film, a microcrystalline oxide semiconductor film, and a CAAC-OS film, for example.

Note that the structures, methods, and the like described in this embodiment can be used as appropriate in combination with any of the structures, methods, and the like described in other embodiments and examples.

Embodiment 3

Figure 12A:
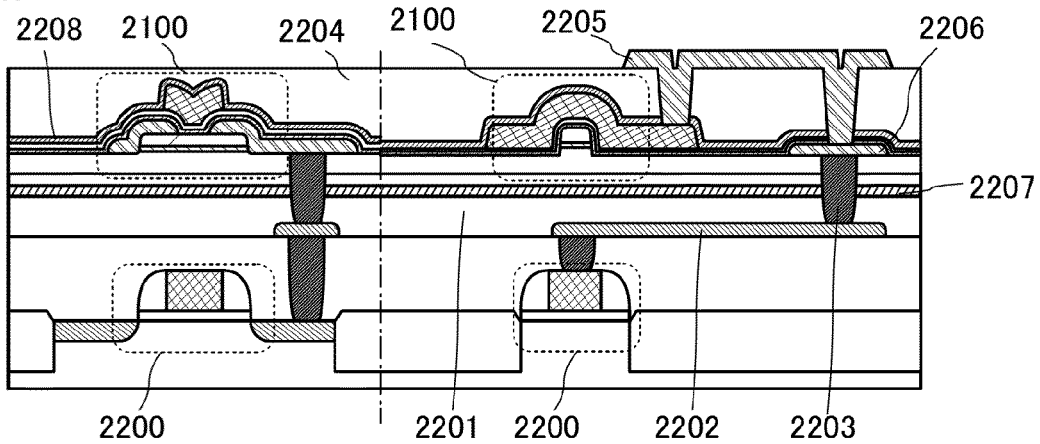
FIGS. 12A to 12D are cross-sectional views and circuit diagrams each illustrating a semiconductor device.

In this embodiment, an example of a circuit including the transistor of one embodiment of the present invention will be described with reference to drawings.
[Cross-Sectional Structure]
FIG. 12A is a cross-sectional view of a semiconductor device of one embodiment of the present invention. The semiconductor device illustrated in FIG. 12A includes a transistor 2200 containing a first semiconductor material in a lower portion and a transistor 2100 containing a second semiconductor material in an upper portion. As the transistor 2100, any of the transistors described in the above embodiment can be used, and in FIG. 12A, an example in which the transistor 150 is used as the transistor 2100 is shown. A cross-sectional view of the transistors in a channel length direction is on the left side of a dashed-dotted line, and a cross-sectional view of the transistors in a channel width direction is on the right side of the dashed-dotted line.

Note that the transistor 2100 may be provided with a back gate.

The first and second semiconductor materials preferably have different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor including an oxide semiconductor has low off-state current.

The transistor 2200 may be either an n-channel transistor or a p-channel transistor; an appropriate transistor is used depending on a circuit. Furthermore, the specific structure of the semiconductor device, such as the material or the structure used for the semiconductor device, is not necessarily limited to those described here except for the use of the transistor of one embodiment of the present invention which includes an oxide semiconductor.

FIG. 12A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

Since the two kinds of transistors are stacked, the area occupied by the circuit can be reduced, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 formed using an oxide semiconductor is provided over the transistor 2200 formed using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 can also be improved.

The insulating film 2207 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 (corresponding to the insulating film 107 in the transistor 150) having a function of preventing diffusion of hydrogen is preferably formed over the transistor 2100 to cover the transistor 2100 including an oxide semiconductor film. For the blocking film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film 2208 covering the transistor 2100, release of oxygen from the oxide semiconductor film included in the transistor 2100 and entry of water and hydrogen into the oxide semiconductor film can be prevented.

Note that the transistor 2200 can be a transistor of various types without being limited to a planar type transistor. For example, the transistor 2200 can be a fin-type transistor, a tri-gate transistor, or the like. An example of a cross-sectional view in such a case is shown in FIG. 12D. An insulating film 2212 is provided over a semiconductor substrate 2211. The semiconductor substrate 2211 has a projecting portion with a thin tip (also referred to a fin). Note that an insulating film may be provided over the projecting portion. The insulating film functions as a mask for preventing the semiconductor substrate 2211 from being etched when the projecting portion is formed. The projecting portion does not necessarily have the thin tip; a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Although the gate electrode 2213 has a two-layer structure in this embodiment, the present invention is not limited to this example, and the gate electrode 2213 may have a single-layer structure or a multilayer structure including three or more layers. Source and drain regions 2215 are formed in the semiconductor substrate 2211. Note that here is shown an example in which the semiconductor substrate 2211 has the projecting portion; however, the semiconductor device of one embodiment of the present invention is not limited thereto. For example, a semiconductor region having a projecting portion may be formed by processing an SOI substrate.

[Circuit Configuration Example]

In the above structure, electrodes of the transistors 2100 and 2200 can be connected in a variety of ways; thus, a variety of circuits can be configured. Examples of circuit configurations which can be achieved by using the semiconductor device of one embodiment of the present invention will be described below.

[CMOS Circuit]

Figure 12B:
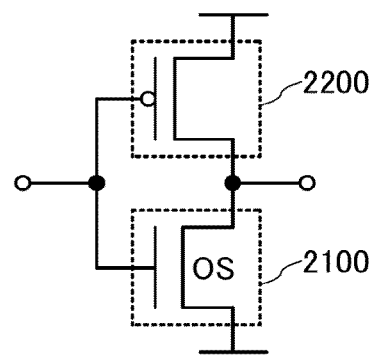

A circuit diagram in FIG. 12B shows a configuration of what is called a CMOS circuit in which the p-channel transistor 2200 and the n-channel transistor 2100 are connected to each other in series and in which gates of them are connected to each other.

[Analog Switch]

Figure 12C:
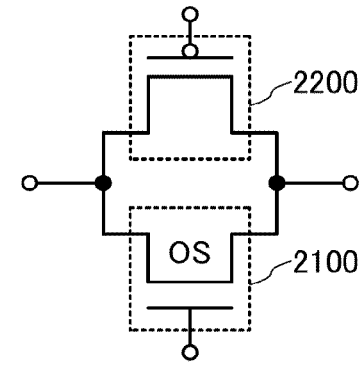
Figure 12D:
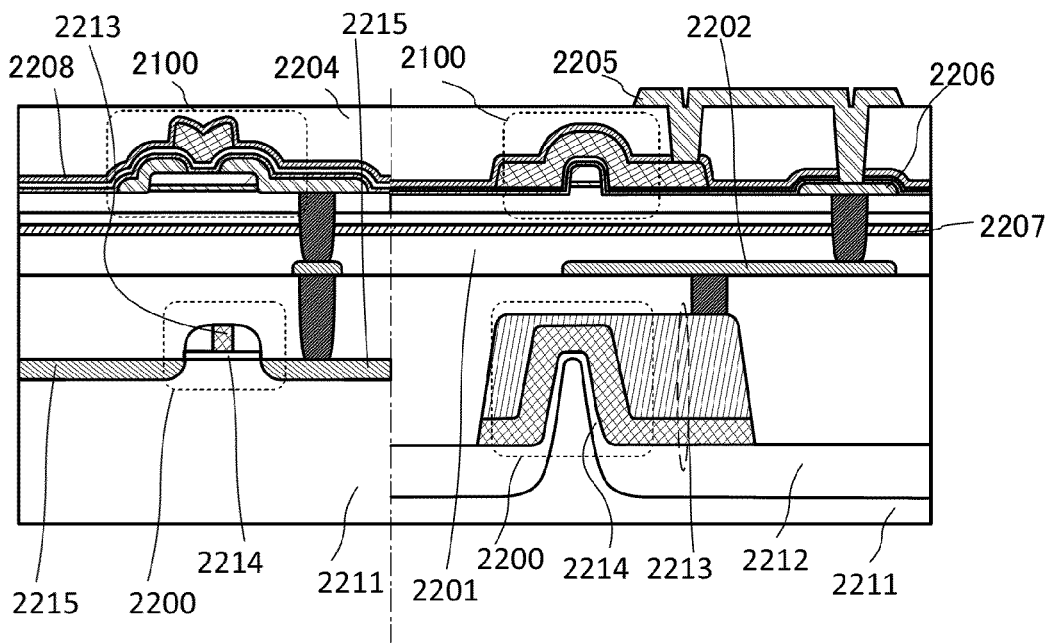

A circuit diagram in FIG. 12C shows a configuration in which sources of the transistors 2100 and 2200 are connected to each other and drains of the transistors 2100 and 2200 are connected to each other. With such a configuration, the transistors can function as what is called an analog switch.

[Example of Memory Device]

Figure 13A:
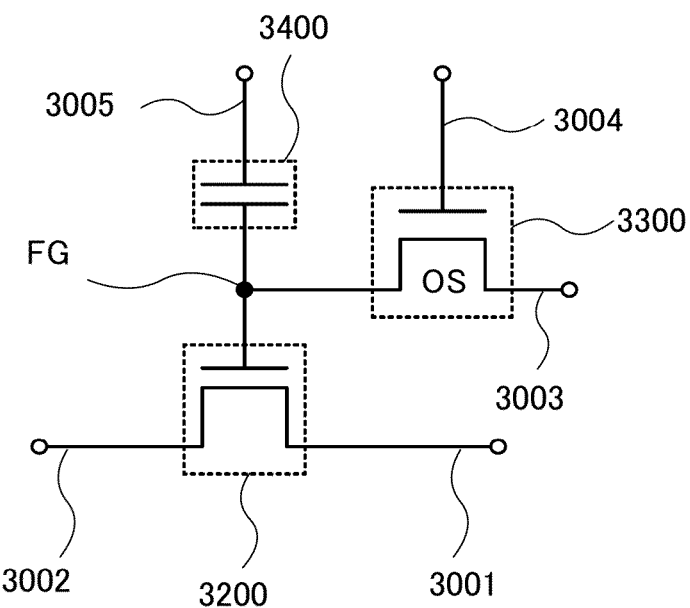
FIGS. 13A to 13C are circuit diagrams and a cross-sectional view each illustrating a memory device.
Figure 13B:
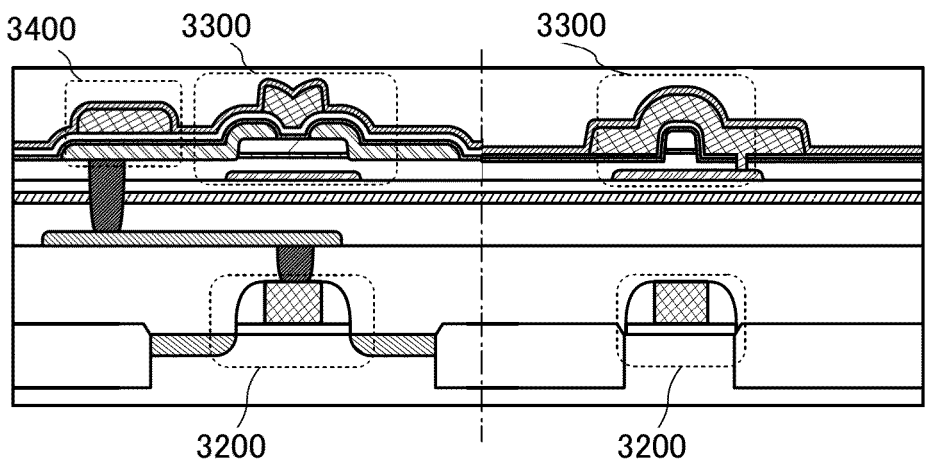
Figure 13C:
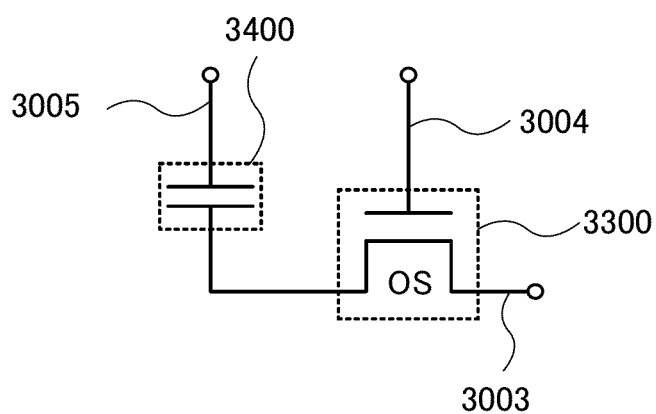

Examples of a semiconductor device (memory device) which includes the transistor of one embodiment of the present invention, which can retain stored data even when not powered, and which has an unlimited number of write cycles are shown in FIGS. 13A to 13C.

The semiconductor device illustrated in FIG. 13A includes a transistor 3200 containing a first semiconductor material, a transistor 3300 containing a second semiconductor material, and a capacitor 3400. Note that any of the above-described transistors can be used as the transistor 3300.

FIG. 13B is a cross-sectional view of the semiconductor device illustrated in FIG. 13A. The semiconductor device in the cross-sectional view has a structure in which the transistor 3300 is provided with a back gate.

In the transistor 3300, a channel is formed in a semiconductor film including an oxide semiconductor. Since the off-state current of the transistor 3300 is low, stored data can be retained for a long time. In other words, power consumption can be sufficiently reduced because a semiconductor memory device in which refresh operation is unnecessary or the frequency of refresh operation is extremely low can be provided.

In FIG. 13A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and a first terminal of the capacitor 3400. A fifth wiring 3005 is electrically connected to a second terminal of the capacitor 3400.

The semiconductor device in FIG. 13A has a feature that the potential of the gate electrode of the transistor 3200 can be retained, and thus enables writing, retaining, and reading of data as follows.

Writing and retaining of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in general, when an n-channel transistor is used as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied to the gate of the transistor 3200 in writing and the potential of the fifth wiring 3005 is $V_0$ ($>V_{th\_H}$), the transistor 3200 is turned on. In the case where the low-level charge is supplied to the gate of the transistor 3200 in writing, the transistor 3200 remains off even when the potential of the fifth wiring 3005 is $V_0$ ($<V_{th\_L}$). Thus, the data retained in the gate of the transistor 3200 can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 13C is different from the semiconductor device illustrated in FIG. 13A in that the transistor 3200 is not provided. In this case, data writing and retaining operations can be performed in a manner similar to those of the semiconductor device illustrated in FIG. 13A.

Here, reading of data will be described. When the transistor 3300 is turned on, the third wiring 3003 which is in a floating state and the capacitor 3400 are electrically connected to each other, and charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ (=$(C_B \times$ $V_{B0}+C\times V_1)/(C_B+C))$ is higher than the potential of the third wiring 3003 in the case of retaining the potential $V_0$ (=($C_B\times V_{B0}+C\times V_0)/(C_B+C))$.

Then, by comparing the potential of the third wiring 3003 with a predetermined potential, data can be read.

In this case, a transistor containing the first semiconductor material may be used in a driver circuit for driving a memory cell, and a transistor containing the second semiconductor material may be stacked over the driver circuit as the transistor 3300.

When a transistor having a channel formation region formed using an oxide semiconductor and having extremely low off-state current is applied to the semiconductor device described in this embodiment, the semiconductor device can retain stored data for an extremely long time. In other words, refresh operation becomes unnecessary or the frequency of the refresh operation can be extremely low, leading to a sufficient reduction in power consumption. Moreover, stored data can be retained for a long time even when not powered (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. That is, the semiconductor device of the disclosed invention does not have a limit on the number of times data can be rewritten, which is a problem of a conventional nonvolatile memory, and the reliability thereof is drastically improved. Moreover, since data is written depending on the state of the transistor (on or off), high-speed operation can be easily achieved.

Note that this embodiment can be combined with any of the other embodiments and examples in this specification as appropriate.

Embodiment 4

In this embodiment, an RF tag that includes the transistor described in the above embodiments or the memory device described in the above embodiment will be described with reference to FIG. 14.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 14. FIG. 14 is a block diagram illustrating a configuration example of an RF tag.

Figure 14:
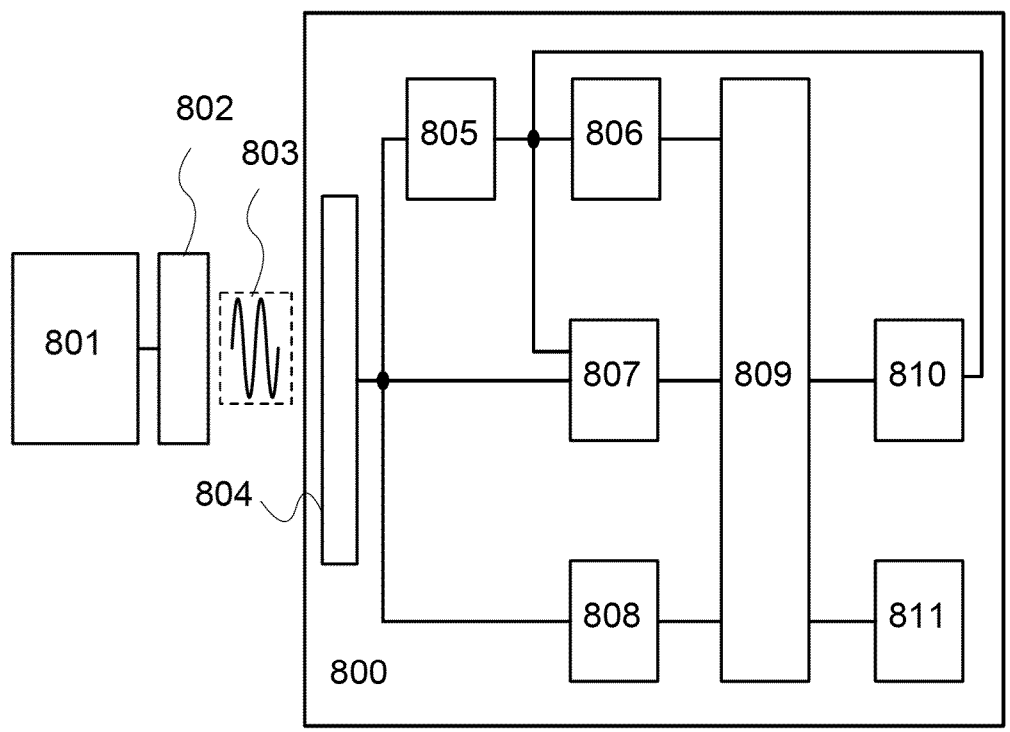
FIG. 14 illustrates a configuration example of an RF tag.

As shown in FIG. 14, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables reverse current to be low enough, for example, an oxide semiconductor. This can suppress the phenomenon of a rectifying function becoming weaker due to generation of reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs much less power (voltage) for data writing than a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Note that this embodiment can be combined with any of the other embodiments and examples in this specification as appropriate.

Embodiment 5

In this embodiment, a CPU that includes the memory device described in the above embodiment will be described.

Figure 15:
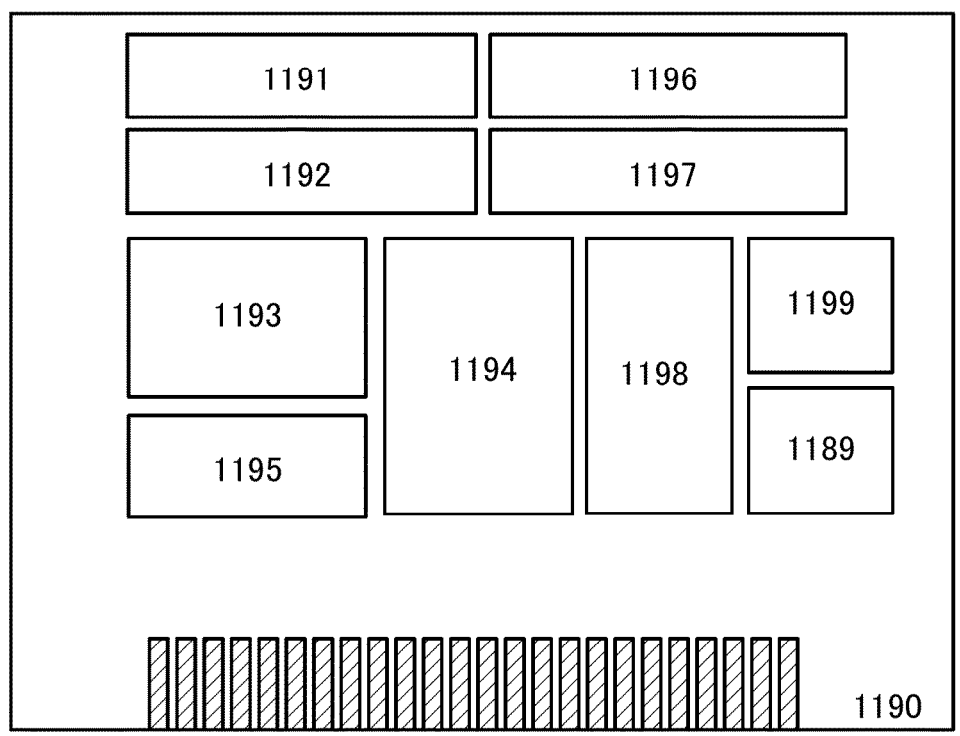
FIG. 15 illustrates a configuration example of a CPU.

FIG. 15 is a block diagram illustrating a configuration example of a CPU at least partly including any of the transistors described in the above embodiments as a component.

The CPU illustrated in FIG. 15 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 15 is just an example in which the configuration is simplified, and an actual CPU may have a variety of configurations depending on the application. For example, the CPU may have the following configuration: a structure including the CPU illustrated in FIG. 15 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 15, a memory cell is provided in the register 1196. For the memory cell of the register 1196, any of the transistors described in the above embodiments can be used.

In the CPU illustrated in FIG. 15, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 16:
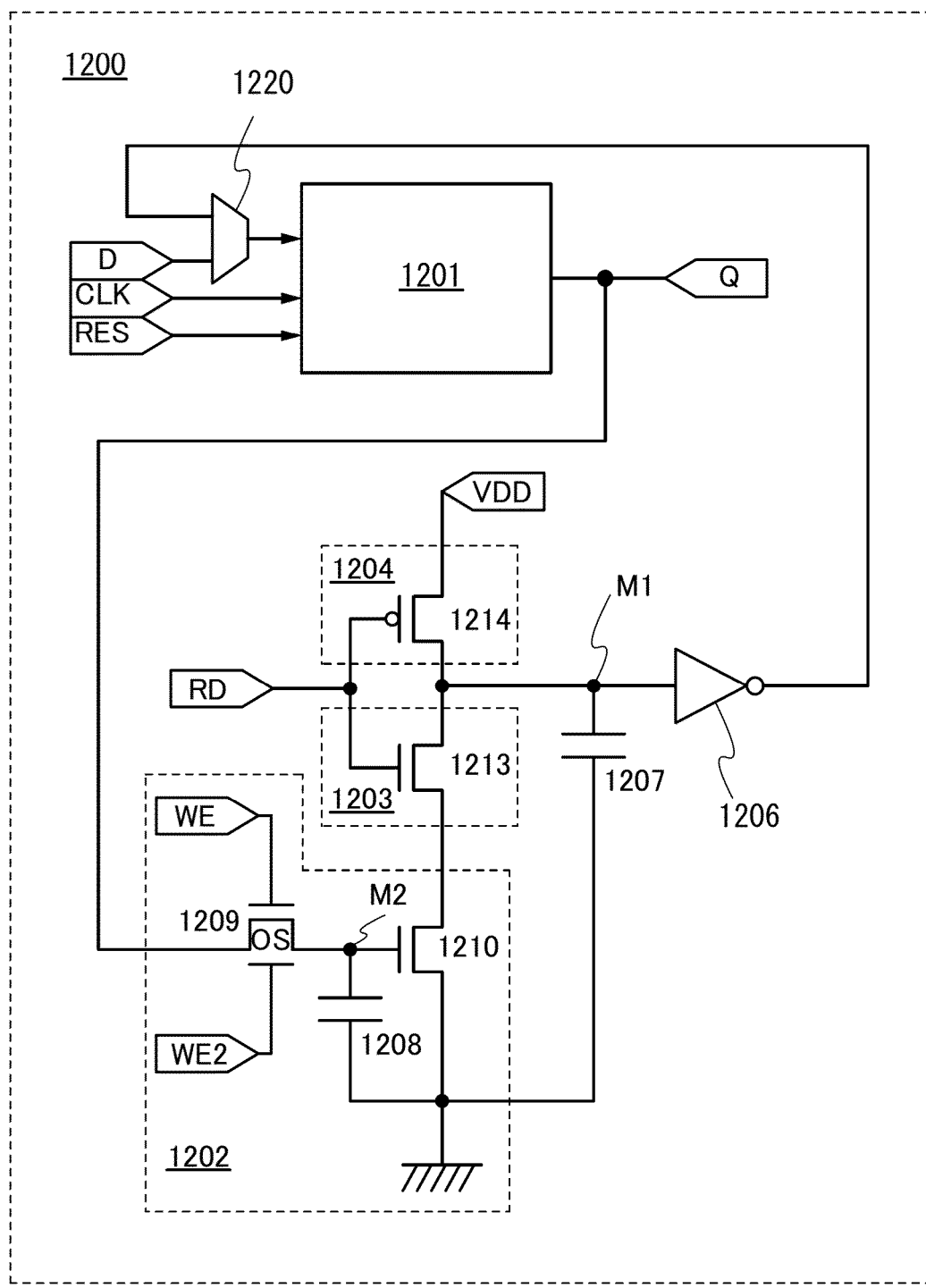
FIG. 16 is a circuit diagram of a memory element.

FIG. 16 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a first gate of the transistor 1209. For example, the first gate (first gate electrode) of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 16 has a structure with a second gate (second gate electrode: back gate). The control signal WE can be input to the first gate and a control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and a drain current of the transistor 1209 at a gate voltage of 0 V can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 16 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 16, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 16, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor film. Further alternatively, in the memory element 1200, a transistor in which a channel is formed in an oxide semiconductor film can be included besides the transistor 1209, and a transistor in which a channel is formed in a layer or the substrate 1190 including a semiconductor other than an oxide semiconductor can be used for the rest of the transistors.

As the circuit 1201 in FIG. 16, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) device.

Note that this embodiment can be combined with any of the other embodiments and examples in this specification as appropriate.

Embodiment 6

In this embodiment, configuration examples of a display device using a transistor of one embodiment of the present invention will be described.

[Configuration Example]

Figure 17A:
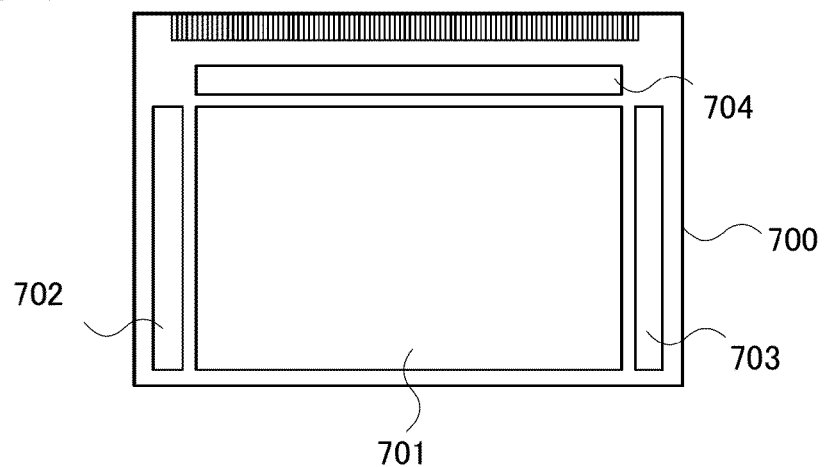
FIG. 17A illustrates a configuration example of a display device and FIGS. 17B and 17C are circuit diagrams of pixels.
Figure 17B:
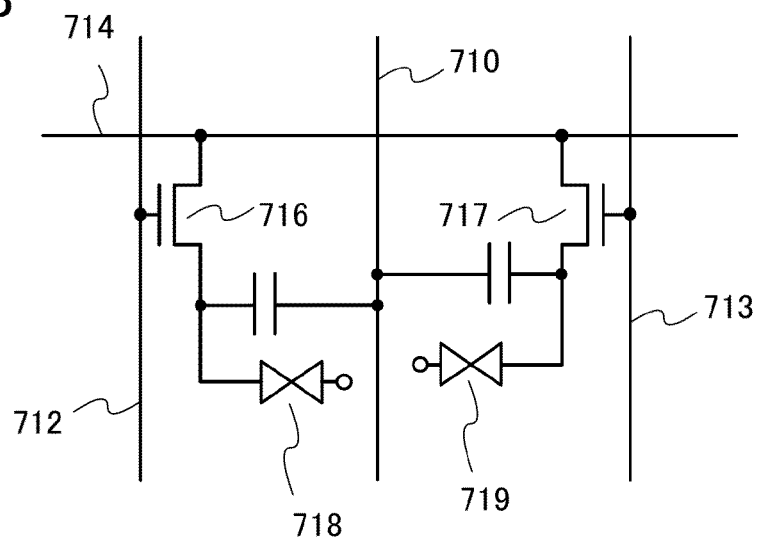
Figure 17C:
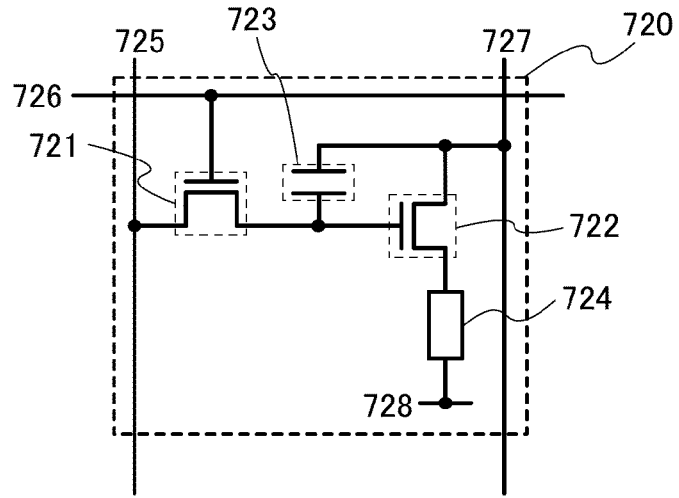

FIG. 17A is a top view of the display device of one embodiment of the present invention. FIG. 17B is a circuit diagram illustrating a pixel circuit that can be used in the case where a liquid crystal element is used in a pixel in the display device of one embodiment of the present invention. FIG. 17C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 17A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 17A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved. One or more of the first scan line driver circuit 702, the second scan line driver circuit 703, and the signal line driver circuit 704 may be mounted on the substrate 700 or provided outside the substrate 700.

[Liquid Crystal Display Device]

FIG. 17B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

A first pixel electrode layer is electrically connected to the transistor 716 and a second pixel electrode layer is electrically connected to the transistor 717. The first pixel electrode layer and the second pixel electrode layer are separated. Shapes of the first pixel electrode layer and the second pixel electrode layer are not especially limited. For example, the first pixel electrode layer may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 17B. For example, a switch, a resistor, a capacitor, a transistor, a sensor, a logic circuit, or the like may be added to the pixel circuit illustrated in FIG. 17B.

[Organic EL Display Device]

FIG. 17C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 17C illustrates an applicable example of a pixel circuit. Here, one pixel includes two n-channel transistors. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted.

Next, a signal input to the driver transistor 722 will be described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 17C. For example, a switch, a resistor, a capacitor, a sensor, a transistor, a logic circuit, or the like may be added to the pixel circuit illustrated in FIG. 17C.

In the case where the transistor shown in any of the above embodiments is used for the circuit shown in FIGS. 17A to 17C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electrical or magnetic effect may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that this embodiment can be combined with any of the other embodiments and examples in this specification as appropriate.

Embodiment 7

In this embodiment, a display module using a semiconductor device of one embodiment of the present invention is described with reference to FIG. 18.

Figure 18:
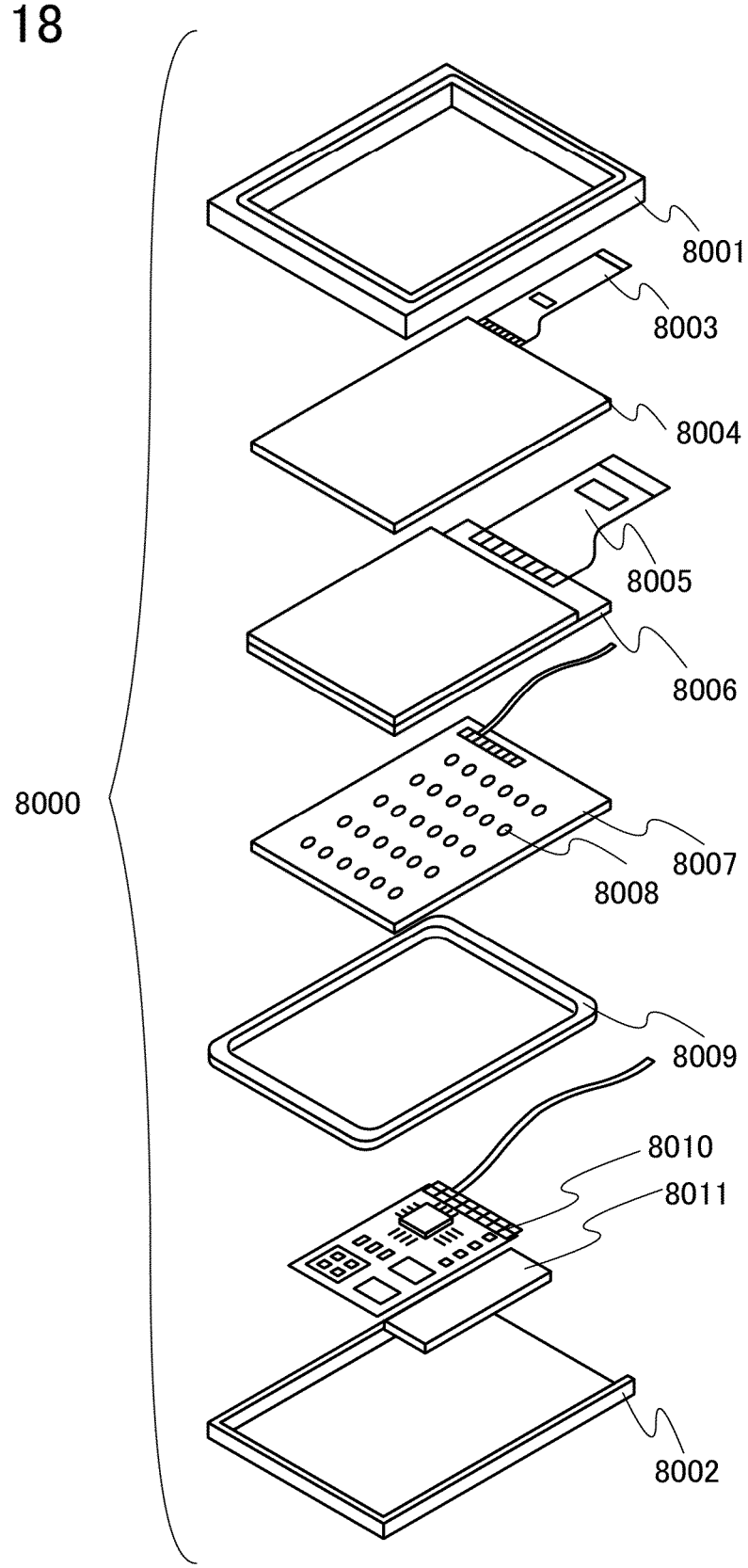
FIG. 18 illustrates a display module.

In a display module 8000 in FIG. 18, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel function is added. An electrode for a touch sensor may be provided in each pixel of the display panel 8006 so that a capacitive touch panel function is added. A display module with a position input function may be used as the display panel 8006. Note that the position input function can be added by providing the display panel 8006 with the touch panel 8004.

The backlight unit 8007 includes a light source 8008. The light source 8008 may be provided at an end portion of the backlight unit 8007 and a light diffusing plate may be used.

The frame 8009 protects the display panel 8006 and also serves as an electromagnetic shield for blocking electromagnetic waves generated by the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. Note that the battery 8011 is not necessary in the case where a commercial power source is used.

The display module 8000 can be additionally provided with a member such as a polarizing plate, a retardation plate, or a prism sheet.

Note that this embodiment can be combined with any of the other embodiments and examples in this specification as appropriate.

Embodiment 8

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 19A to 19F illustrate specific examples of these electronic devices.

Figure 19A:
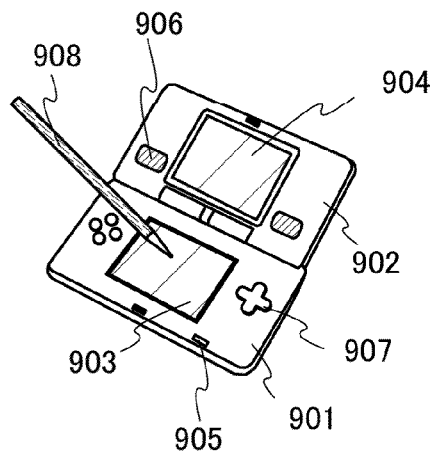
FIGS. 19A to 19F each illustrate an electronic device.

FIG. 19A illustrates a portable game machine including a housing 901, a housing 902, a display portion 903, a display portion 904, a microphone 905, a speaker 906, an operation key 907, a stylus 908, and the like. Although the portable game machine in FIG. 19A has the two display portions 903 and 904, the number of display portions included in a portable game machine is not limited to this.

Figure 19B:
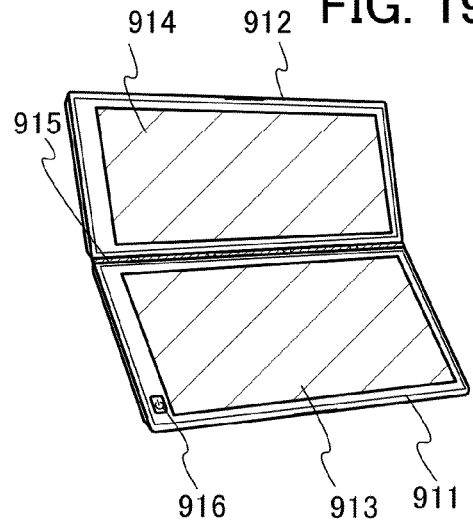

FIG. 19B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 19C:
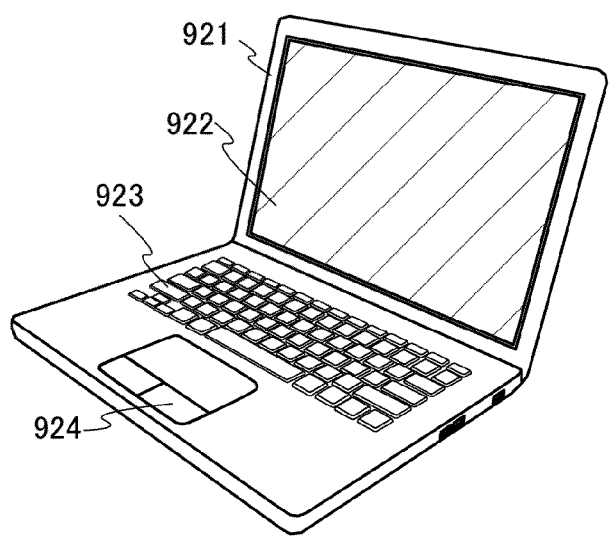

FIG. 19C illustrates a notebook personal computer, which includes a housing 921, a display portion 922, a keyboard 923, a pointing device 924, and the like.

Figure 19D:
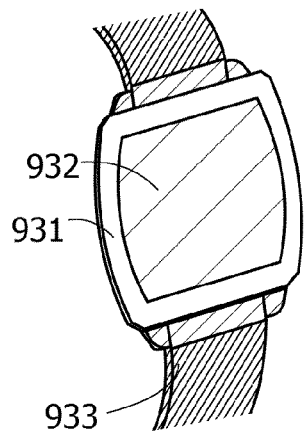

FIG. 19D illustrates a wrist-watch-type information terminal, which includes a housing 931, a display portion 932, a wristband 933, and the like. The display portion 932 may be a touch panel.

Figure 19E:
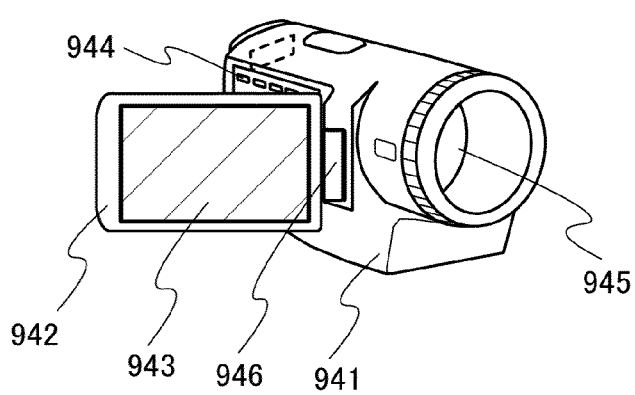

FIG. 19E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 19F:
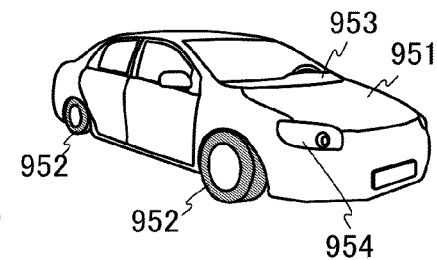
Figure 20A:
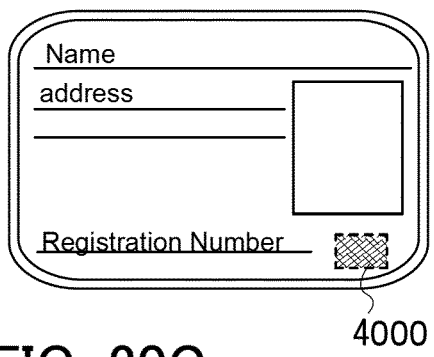
FIGS. 20A to 20F each illustrate an application example of an RF device.
Figure 20B:
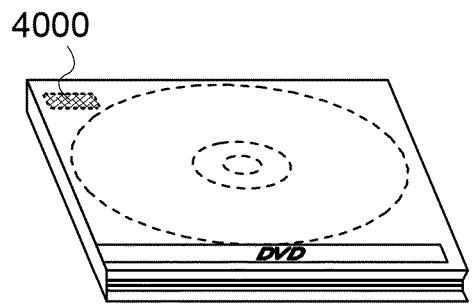
Figure 20C:
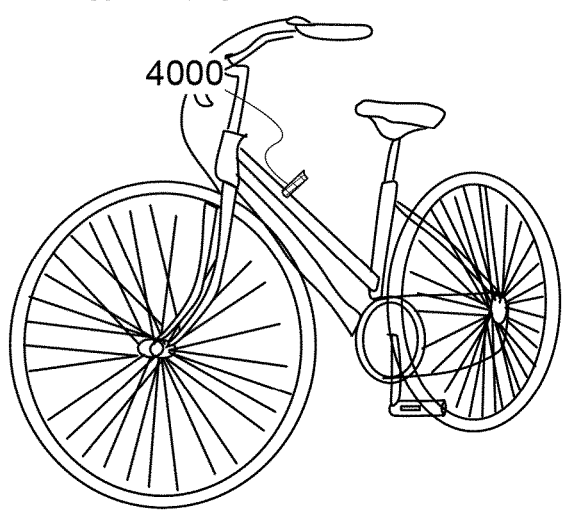
Figure 20D:
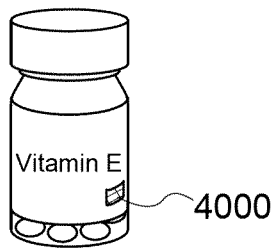
Figure 20E:
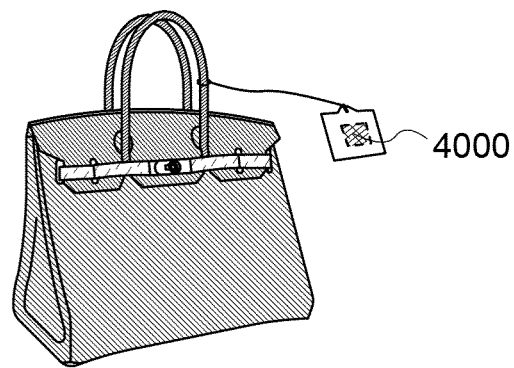
Figure 20F:
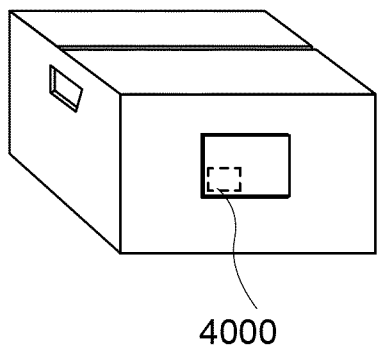

FIG. 19F illustrates an example of a car including a car body 951, wheels 952, a dashboard 953, lights 954, and the like.

Note that this embodiment can be combined with any of the other embodiments and examples in this specification as appropriate.

Embodiment 9

In this embodiment, application examples of an RF device of one embodiment of the present invention will be described with reference to FIGS. 20A to 20F. The RF device is widely used and can be provided for, for example, products such as bills, coins, securities, bearer bonds, documents (e.g., driver's licenses or resident's cards, see FIG. 20A), recording media (e.g., DVD or video tapes, see FIG. 20B), vehicles (e.g., bicycles, see FIG. 20C), packaging containers (e.g., wrapping paper or bottles, see FIG. 20D), personal belongings (e.g., bags or glasses, see FIG. 20E), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 20E and 20F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic devices, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF device can be preferably used for application in which data is not frequently written or read.

Note that this embodiment can be combined with any of the other embodiments and examples in this specification as appropriate.

Example 1

In this example, the crystal states of metal oxide films were measured by X-ray diffraction (XRD).

First, a thermal oxide film was formed on a silicon wafer. The thermal oxide film was formed to a thickness of 100 nm at 950° C. in an oxygen atmosphere containing HCl at 3%. Next, a 300-nm-thick silicon oxide film was formed over the thermal oxide film by a sputtering method. The silicon oxide film was formed in the following manner: silicon oxide was used as a sputtering target, oxygen was supplied to a treatment chamber of a sputtering apparatus as a sputtering gas at a flow rate of 50 sccm, the pressure in the treatment chamber was controlled to 0.4 Pa, and an RF power of 1.5 kW was supplied. Note that the substrate temperature in the formation of the silicon oxide film was 100° C.

Next, a metal oxide film was formed over the silicon oxide film. As the metal oxide film, a 100-nm-thick Ga—Zn oxide (also denoted by GZO) film was formed. The GZO film was formed using a sputtering target containing Ga and Zn at an atomic ratio of 2:1 (also denoted by GZO(2:1)) in a mixed atmosphere of argon and oxygen (argon at 20 sccm and oxygen at 10 sccm) under the conditions where the pressure was 0.4 Pa, a high-frequency (RF) power of 0.4 kW was applied, the distance between the target and the substrate was 130 mm, and the substrate temperature was 200° C. Through the above process, a sample was manufactured. In addition, other samples were manufactured under similar conditions using a sputtering target containing Ga and Zn at an atomic ratio of 10:1 (also denoted by GZO(10:1)) and a sputtering target containing Ga and Zn at an atomic ratio of 20:1 (also denoted by GZO(20:1)).

Note that when the target has an atomic ratio of Ga:Zn=x:y, x/(x+y) is 0.67 for GZO(2:1), 0.91 for GZO(10:1), or 0.95 for GZO(20:1).

The compositions of the metal oxide films were measured by inductively coupled plasma mass spectrometry (ICP-MS). The composition in atomic ratio of the metal oxide film formed using GZO(2:1) was Ga:Zn=2:0.6. The composition in atomic ratio of the metal oxide film formed using GZO(10:1) was Ga:Zn=10:0.6. The composition in atomic ratio of the metal oxide film formed using GZO(20:1) was Ga:Zn=20:0.7. Note that when the metal oxide film has an atomic ratio of M:Zn=a:b, a/(a+b) is 0.77 for the metal oxide film formed using GZO(2:1), 0.94 for the metal oxide film formed using GZO(10:1), or 0.97 for the metal oxide film formed using GZO(20:1).

For comparison, instead of the GZO films, a 100-nm-thick IGZO film formed using a target of In:Ga:Zn=1:3:2 [atomic ratio] (this film is also referred to as IGZO(132) film) was manufactured as a sample, and a 100-nm-thick gallium oxide film (also referred to as $GaO_x$ film) was manufactured as another sample. The IGZO(132) film was formed using the target of In:Ga:Zn=1:3:2 [atomic ratio] in a mixed atmosphere of argon and oxygen (argon at 30 sccm and oxygen at 15 sccm) under the conditions where the pressure was 0.4 Pa, a source power (DC) of 0.5 kW was applied, the distance between the target and the substrate was 60 mm, and the substrate temperature was 200° C. The $GaO_x$ film was formed using a sputtering target of $Ga_2O_3$ in a mixed atmosphere of argon and oxygen (argon at 20 sccm and oxygen at 10 sccm) under the conditions where the pressure was 0.4 Pa, a high-frequency (RF) power of 0.4 kW was applied, the distance between the target and the substrate was 130 mm, and the substrate temperature was 200° C.

Figure 21:
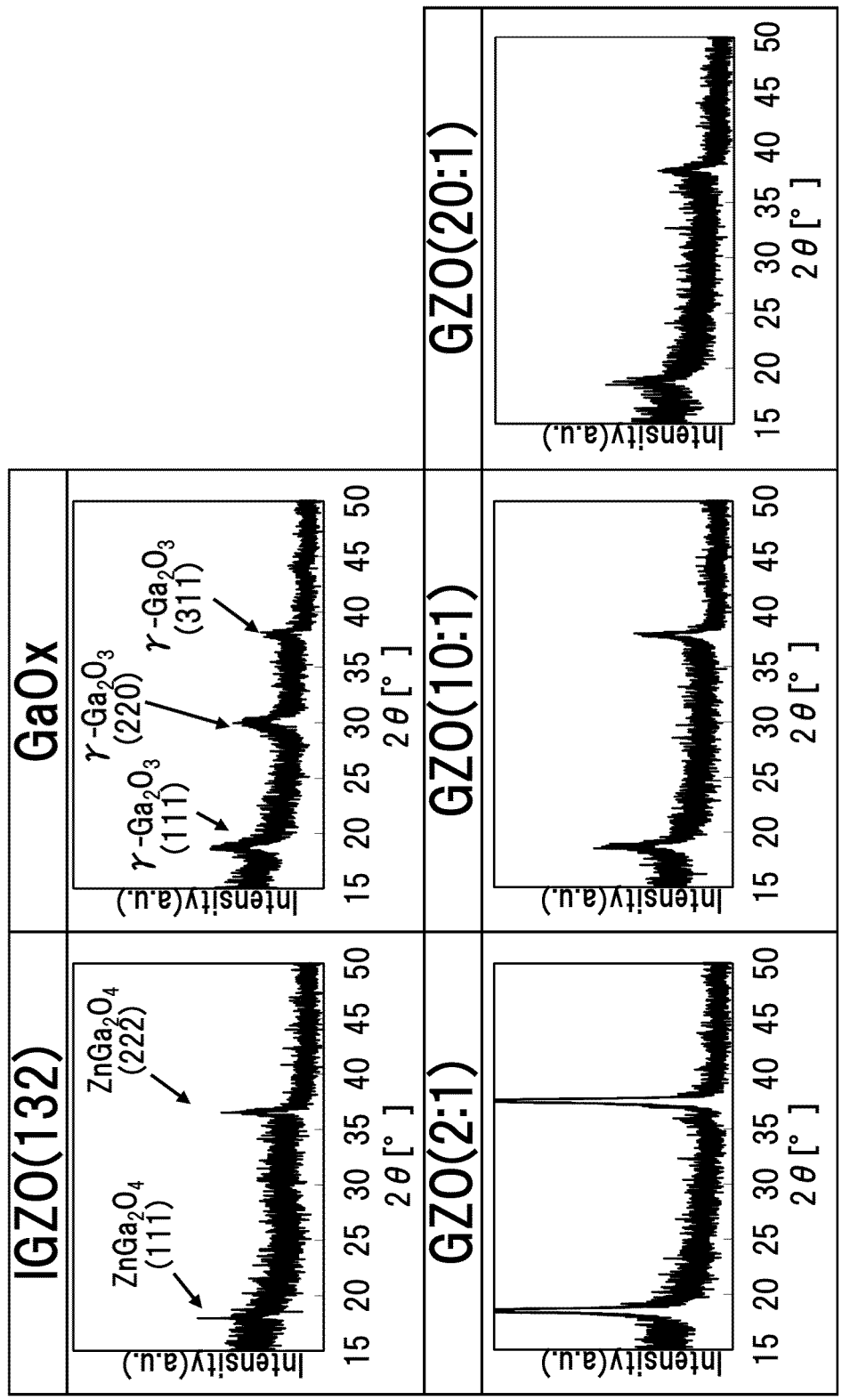
FIG. 21 shows results of XRD measurement.

FIG. 21 shows XRD spectra of the manufactured samples which were measured by an out-of-plane method. In FIG. 21, the vertical axis represents X-ray diffraction intensity (arbitrary unit) and the horizontal axis represents diffraction angle 2θ (deg.). Note that the XRD spectra were measured with the use of an X-ray diffractometer D8 ADVANCE manufactured by Bruker AXS.

The IGZO(132) film shows a peak derived from $ZnGa_2O_4$ having a spinel structure. The $GaO_x$ film shows a peak derived from $\gamma$-$Ga_2O_3$.

Example 2

In this example, the crystal states of metal oxide films were measured by X-ray diffraction (XRD).

First, a thermal oxide film was formed on a silicon wafer. The thermal oxide film was formed to a thickness of 100 nm at 950° C. in an oxygen atmosphere containing HCl at 3%. Next, a 300-nm-thick silicon oxide film was formed over the thermal oxide film by a sputtering method. The silicon oxide film was formed in the following manner: silicon oxide was used as a sputtering target, oxygen was supplied to a treatment chamber of a sputtering apparatus as a sputtering gas at a flow rate of 50 sccm, the pressure in the treatment chamber was controlled to 0.4 Pa, and an RF power of 1.5 kW was supplied. Note that the substrate temperature in the formation of the silicon oxide film was 100° C.

Next, a metal oxide film was formed over the silicon oxide film. As the metal oxide film, a 100-nm-thick Ga—Zn oxide (also denoted by GZO) film was formed. The GZO film was formed using a sputtering target containing Ga and Zn at an atomic ratio of 3:1 (also denoted by GZO(3:1)) in a mixed atmosphere of argon and oxygen (argon at 20 sccm and oxygen at 10 sccm) under the conditions where the pressure was 0.4 Pa, a high-frequency (RF) power of 0.4 kW was applied, the distance between the target and the substrate was 130 mm, and the substrate temperature was 200° C. Through the above process, a sample was manufactured. In addition, another sample was manufactured under similar conditions using a sputtering target containing Ga and Zn at an atomic ratio of 5:1 (also denoted by GZO(5:1)).

Note that when the target has an atomic ratio of Ga:Zn=x:y, x/(x+y) is 0.75 for GZO(3:1) or 0.83 for GZO(5:1).

The compositions of the metal oxide films were measured by ICP-MS. The composition in atomic ratio of the metal oxide film formed using GZO(3:1) was Ga:Zn=3:0.6. The composition in atomic ratio of the metal oxide film formed using GZO(5:1) was Ga:Zn=5:0.6. Note that when the metal oxide film has an atomic ratio of M:Zn=a:b, a/(a+b) is 0.83 for the metal oxide film formed using GZO(3:1) or 0.89 for the metal oxide film formed using GZO(5:1).

Figure 29:
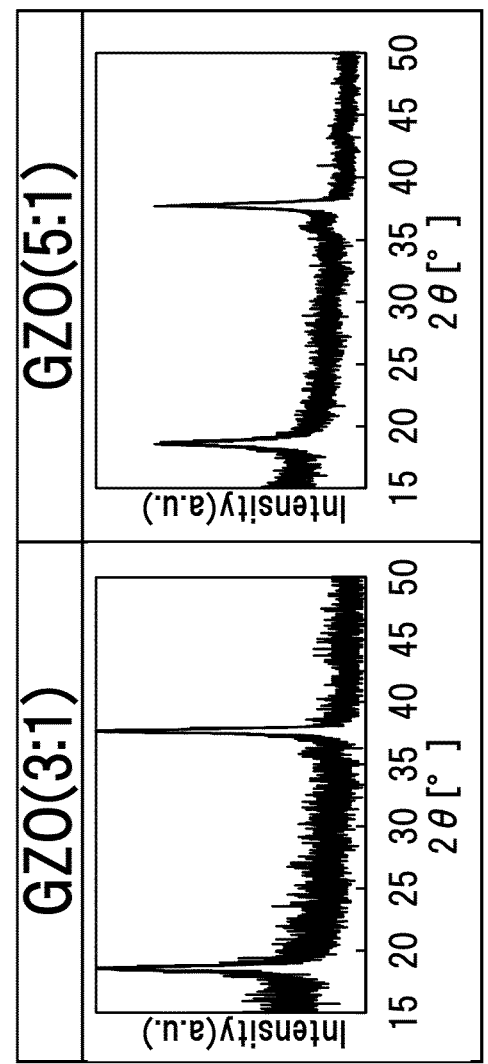
FIG. 29 shows results of XRD measurement.

FIG. 29 shows XRD spectra of the manufactured samples which were measured by an out-of-plane method. In FIG. 29, the vertical axis represents X-ray diffraction intensity (arbitrary unit) and the horizontal axis represents diffraction angle 2θ (deg.). Note that the XRD spectra were measured with the use of an X-ray diffractometer D8 ADVANCE manufactured by Bruker AXS.

The GZO(3:1) film shows a higher peak intensity than the GZO(5:1) film. Example 1 and this example demonstrate that the peak intensity increases as the proportion of gallium in the metal oxide film increases.

Example 3

In this example, transistors were fabricated, and electrical characteristics of the fabricated transistors were evaluated.

First, a method for forming the samples of this example will be described.

By thermal oxidation of a silicon wafer, a 100-nm-thick thermal oxide film was formed on a surface of the silicon wafer. The thermal oxidation was performed at 950° C. for four hours in a thermal oxidation atmosphere containing HCl at 3 vol % with respect to oxygen.

Then, a 300-nm-thick silicon oxynitride film was formed over the thermal oxide film by a PECVD method using silane at a flow rate of 2.3 sccm and dinitrogen monoxide at a flow rate of 800 sccm as source gases under the conditions where the pressure in a reaction chamber was 40 Pa, the substrate temperature was 400° C., and a high-frequency (RF) power of 50 W was applied.

Next, the silicon oxynitride film was subjected to polishing treatment, and then, heat treatment was performed. The heat treatment was performed in a vacuum at 450° C. for one hour.

Then, an oxygen ion ($^{16}O^+$) was implanted into the silicon oxynitride film by an ion implantation method under the conditions where the acceleration voltage was 60 kV, the dosage was $2.0 \times 10^{16}$ ions/cm$^2$, the tilt angle was 7°, and the twist angle was 72°.

Then, a 10-nm-thick first oxide semiconductor film and a 40-nm-thick second oxide semiconductor film were stacked over the silicon oxynitride film by a sputtering method. The first oxide semiconductor film was formed using a target containing In, Ga, and Zn at an atomic ratio of 1:3:4 (also denoted by IGZO(134)) in a mixed atmosphere of argon and oxygen (argon at 40 sccm and oxygen at 5 sccm) under the conditions where the pressure was 0.4 Pa, a source power (DC) of 0.5 kW was applied, the distance between the target and the substrate was 60 mm, and the substrate temperature was 200° C. The second oxide semiconductor film was formed using a target containing In, Ga, and Zn at an atomic ratio of 1:1:1 (IGZO(111)) in a mixed atmosphere of argon and oxygen (argon at 30 sccm and oxygen at 15 sccm) under the conditions where the pressure was 0.4 Pa, a source power (DC) of 0.5 kW was applied, the distance between the target and the substrate was 60 mm, and the substrate temperature was 300° C.

Next, heat treatment was performed at 450° C. in a nitrogen atmosphere for one hour, and after that, another heat treatment was performed at 450° C. in an oxygen atmosphere for one hour.

Next, a 150-nm-thick tungsten film was formed over the second oxide semiconductor film by a sputtering method using a tungsten target in an atmosphere of argon (Ar) at a flow rate of 80 sccm as a deposition gas under the conditions where the pressure was 0.8 Pa, the substrate temperature was 230° C., the distance between the target and the substrate was 60 mm, and a source power (DC) of 1.0 kW was applied.

Next, a resist mask was formed over the tungsten film, and the tungsten film was processed by ICP etching three times to form a source electrode and a drain electrode. The first etching was performed in a mixed atmosphere of carbon tetrafluoride (CF$_4$) at a flow rate of 55 sccm, oxygen (O$_2$) at a flow rate of 55 sccm, and chlorine (Cl$_2$) at a flow rate of 45 sccm under the conditions where the source power was 3000 W, the bias power was 110 W, the pressure was 0.67 Pa, and the substrate temperature was 40° C. The second etching was performed in an atmosphere of oxygen (O$_2$) at a flow rate of 100 sccm under the conditions where the source power was 2000 W, the bias power was 0 W, the pressure was 3.0 Pa, and the substrate temperature was 40° C. The third etching was performed in a mixed atmosphere of carbon tetrafluoride (CF$_4$) at a flow rate of 55 sccm, oxygen (O$_2$) at a flow rate of 55 sccm, and chlorine (Cl$_2$) at a flow rate of 45 sccm under the conditions where the source power was 3000 W, the bias power was 110 W, the pressure was 0.67 Pa, and the substrate temperature was 40° C.

Then, the first and second oxide semiconductor films were processed into island shapes by ICP etching. The etching was performed in an atmosphere of boron trichloride (BCl$_3$) at a flow rate of 80 sccm under the conditions where the source power was 450 W, the bias power was 100 W, the pressure was 1.2 Pa, and the substrate temperature was 70° C.

Next, a metal oxide film was formed to a thickness of 5 nm over the second oxide semiconductor film, the source electrode, and the drain electrode. As the metal oxide film, a GZO film or a GaO$_x$ film was used.

The GZO film was formed using a sputtering target containing Ga and Zn in a mixed atmosphere of argon and oxygen (argon at 20 sccm and oxygen at 10 sccm) under the conditions where the pressure was 0.4 Pa, a high-frequency (RF) power of 0.4 kW was applied, the distance between the target and the substrate was 130 mm, and the substrate temperature was 200° C.

As the target containing Ga and Zn, a target with an atomic ratio of Ga:Zn=2:1 (also denoted by GZO(2:1)), a target with an atomic ratio of Ga:Zn=10:1 (also denoted by GZO(10:1)), or a target with an atomic ratio of Ga:Zn=20:1 (also denoted by GZO(20:1)) was used.

The GaO$_x$ film was formed using a sputtering target of Ga$_2$O$_3$ in a mixed atmosphere of argon and oxygen (argon at 20 sccm and oxygen at 10 sccm) under the conditions where the pressure was 0.4 Pa, a high-frequency (RF) power of 0.4 kW was applied, the distance between the target and the substrate was 130 mm, and the substrate temperature was 200° C.

After that, a 20-nm-thick silicon oxynitride film to be a gate insulating film was formed over the metal oxide film by a PECVD method using silane (SiH$_4$) at a flow rate of 1 sccm and dinitrogen monoxide (N$_2$O) at a flow rate of 800 sccm as source gases under the conditions where the pressure in a reaction chamber was 200 Pa, the substrate temperature was 350° C., and a high-frequency (RF) power of 150 W was supplied to parallel plate electrodes with a 60 MHz high-frequency power source.

Next, a 30-nm-thick tantalum nitride film was formed over the silicon oxynitride film by a sputtering method using a tantalum nitride target and an argon (Ar) gas at a flow rate of 50 sccm and a nitrogen (N$_2$) gas at a flow rate of 10 sccm as deposition gases under the conditions where the pressure was 0.6 Pa, the substrate temperature was room temperature, the distance between the target and the substrate was 50 mm, and a source power (DC) of 1 kW was applied. Over the tantalum nitride film, a 135-nm-thick tungsten film was formed by a sputtering method using a tungsten target and an argon (Ar) gas at a flow rate of 100 sccm as a deposition gas under the conditions where the pressure was 2.0 Pa, the substrate temperature was 230° C., the distance between the target and the substrate was 60 mm, and a source power (DC) of 4.0 kW was applied.

After that, the tantalum nitride film and the tungsten film were subjected to ICP etching twice to form a gate electrode. The first etching was performed in a mixed atmosphere of a carbon tetrafluoride ($CF_4$) gas at a flow rate of 55 sccm, a chlorine ($Cl_2$) gas at a flow rate of 45 sccm, and an oxygen ($O_2$) gas at a flow rate of 55 sccm under the conditions where the source power was 3000 W, the bias power was 110 W, and the pressure was 0.67 Pa. The second etching was performed in an atmosphere of chlorine ($Cl_2$) at a flow rate of 100 sccm under the conditions where the source power was 1000 W, the bias power was 50 W, and the pressure was 0.67 Pa.

Then, with the use of the gate electrode as a mask, the gate insulating film and the metal oxide film were processed into an island shape by ICP etching in an atmosphere of boron trichloride ($BCl_3$) at a flow rate of 80 sccm under the conditions where the source power was 450 W, the bias power was 100 W, the pressure was 1.2 Pa, and the substrate temperature was 70° C.

Next, a 70-nm-thick aluminum oxide film was formed over the gate electrode, the source electrode, and the drain electrode by a sputtering method using an aluminum oxide target and an argon (Ar) gas at a flow rate of 25 sccm and an oxygen ($O_2$) gas at a flow rate of 25 sccm as deposition gases under the conditions where the pressure was 0.4 Pa, the substrate temperature was 250° C., the distance between the target and the substrate was 60 mm, and an RF power of 2.5 kW was applied.

After that, over the aluminum oxide film, a 300-nm-thick silicon oxynitride film was formed by a PECVD method using silane ($SiH_4$) at a flow rate of 5 sccm and dinitrogen monoxide ($N_2O$) at a flow rate of 1000 sccm as source gases under the conditions where the pressure in a reaction chamber was 133 Pa, the substrate temperature was 325° C., and a high-frequency power of 35 W was supplied to parallel plate electrodes with a 13.56 MHz high-frequency power source.

Through the above steps, the transistors were fabricated. Note that three types of transistors were prepared. A first transistor has a channel length L of 0.48 μm and a channel width of 0.8 μm. A second transistor has a channel length L of 0.83 μm and a channel width of 0.8 μm. A third transistor has a channel length L of 0.83 μm and a channel width of 50 μm.

In each of the fabricated transistors, a drain current ($I_d$: [A]) was measured under the conditions where the drain voltage ($V_d$: [V]) was set to 0.1 V or 1.8 V and the gate voltage ($V_g$: [V]) was swept from −3 V to 3 V. In addition, the field-effect mobility ($\mu_{FE}$: [$cm^2$/Vs]) at $V_d$=0.1 V was measured. FIGS. 22A to 22D, FIGS. 23A to 23D, and FIGS. 24A to 24D show the measurement results.

Figure 22A:
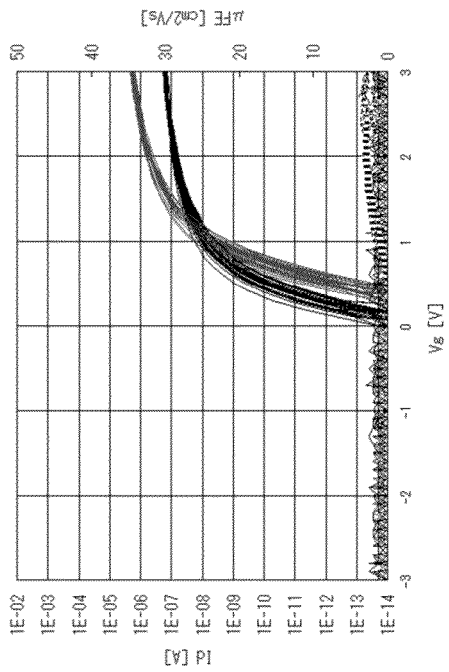
FIGS. 22A to 22D show electrical characteristics of transistors.
Figure 22B:
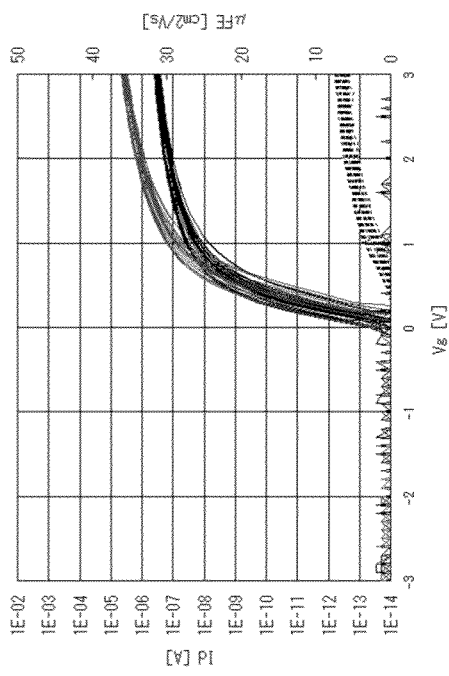
Figure 22C:
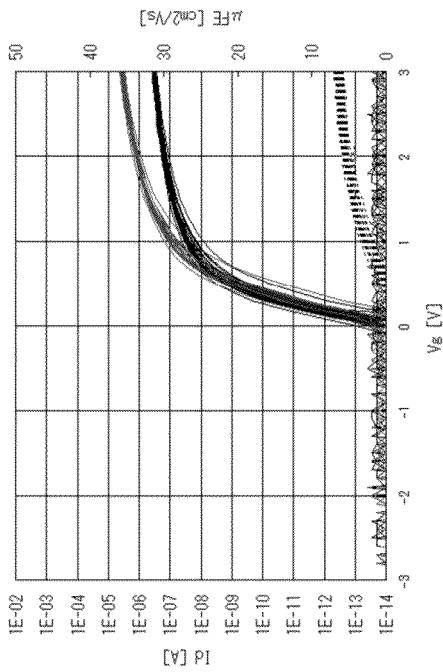
Figure 22D:
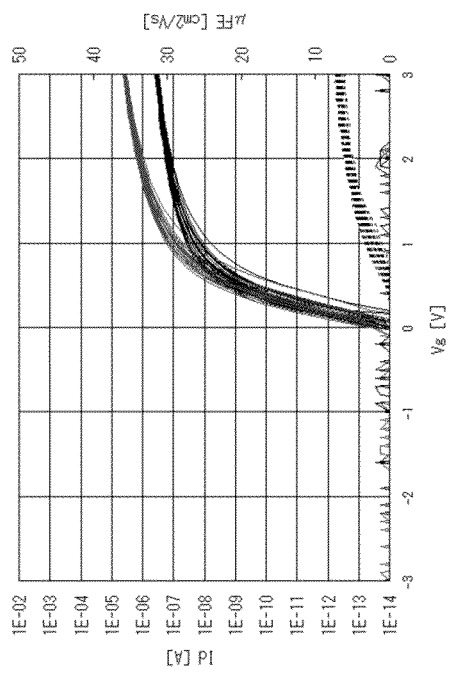
Figure 23B:
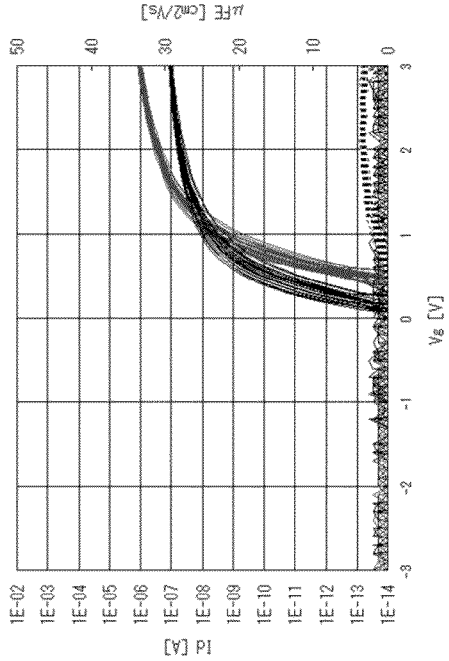
FIGS. 23A to 23D show electrical characteristics of transistors.
Figure 23D:
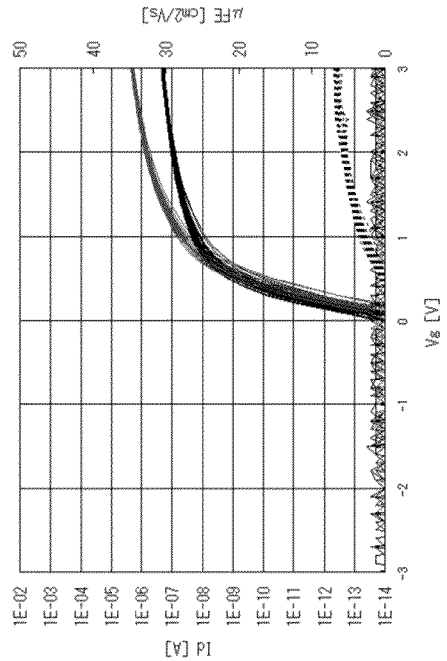
Figure 23A:
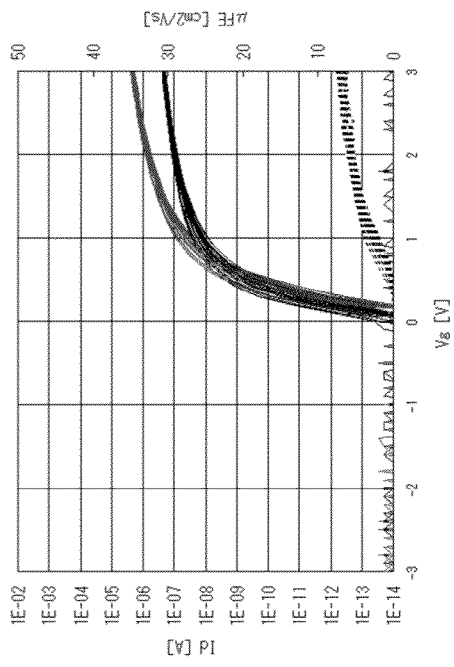
Figure 23C:
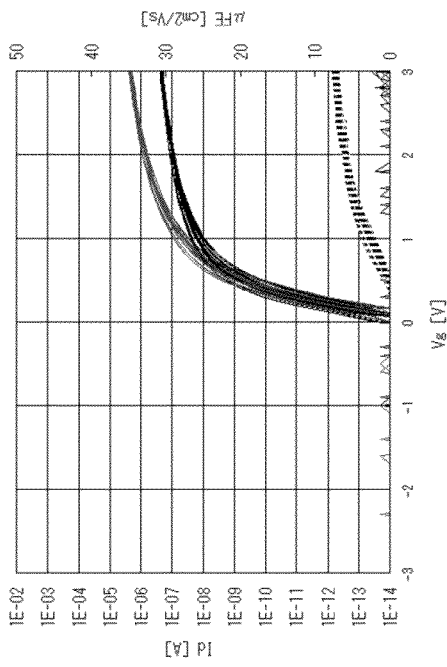
Figure 24A:
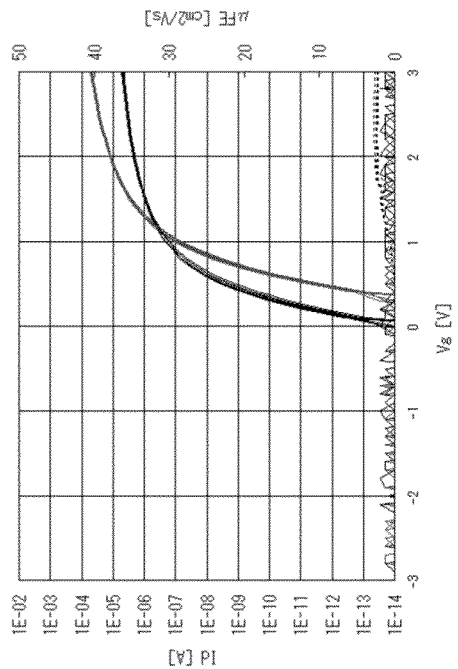
FIGS. 24A to 24D show electrical characteristics of transistors.
Figure 24B:
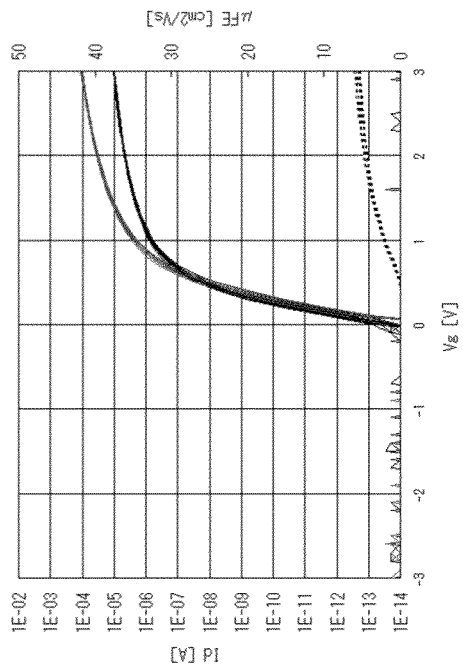
Figure 24C:
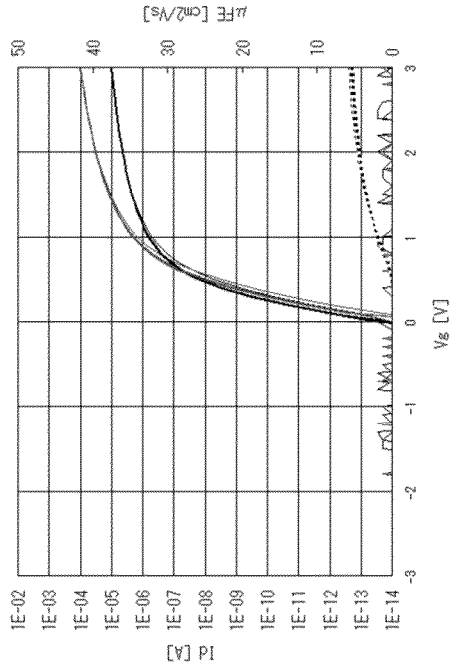
Figure 24D:
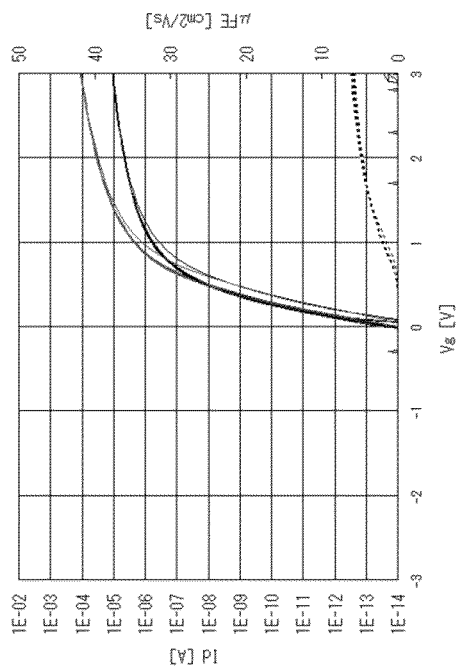
Figure 25A:
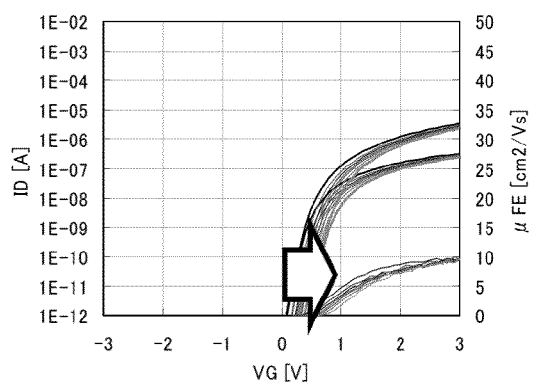
FIGS. 25A to 25D show electrical characteristics of transistors.
Figure 25B:
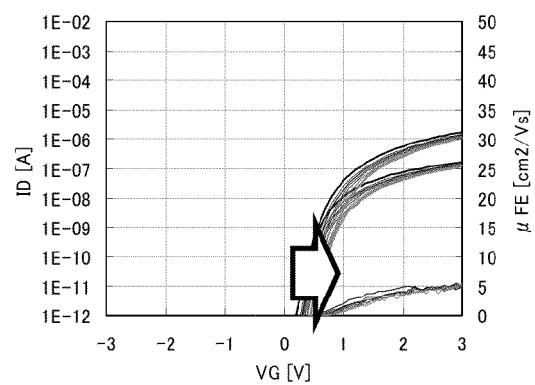
Figure 25C:
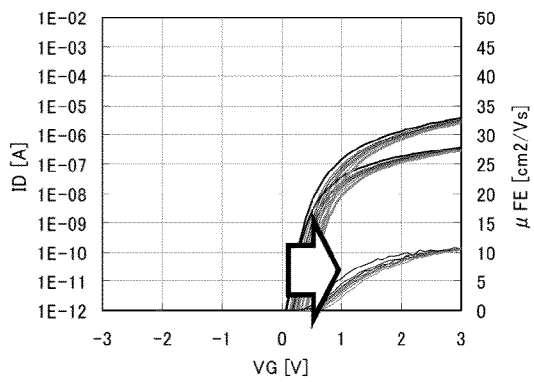
Figure 25D:
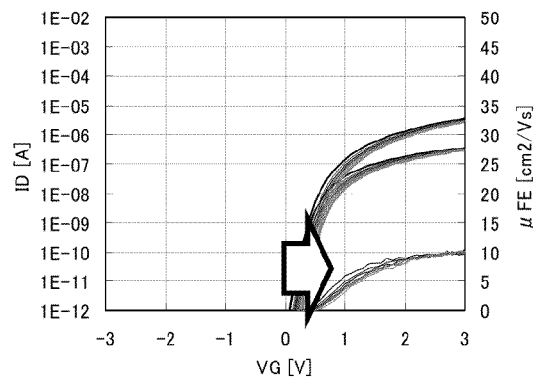
Figure 26A:
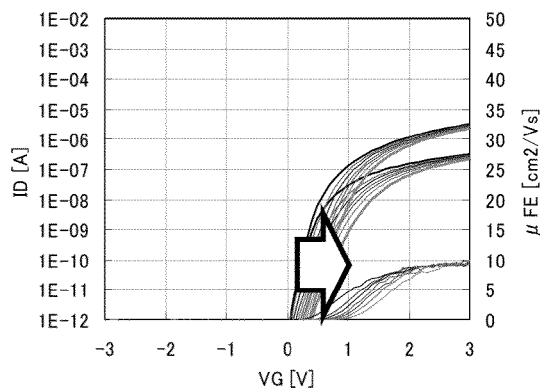
FIGS. 26A to 26D show electrical characteristics of transistors.
Figure 26B:
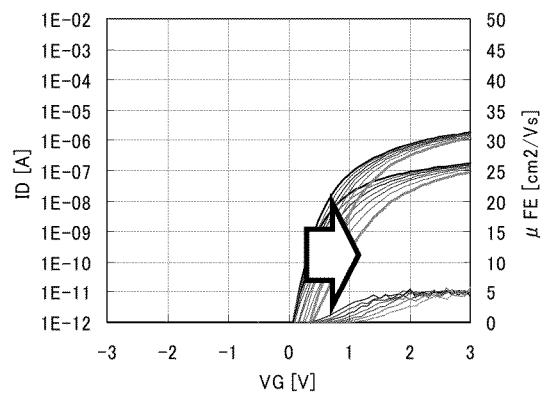
Figure 26C:
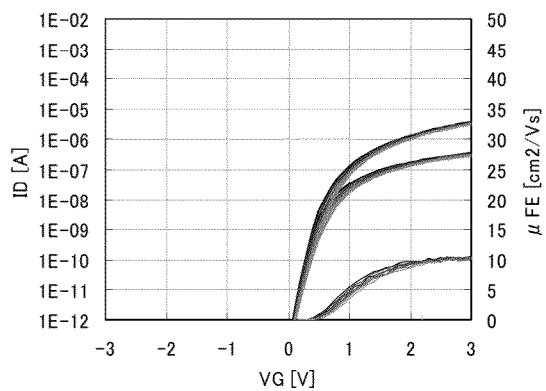
Figure 26D:
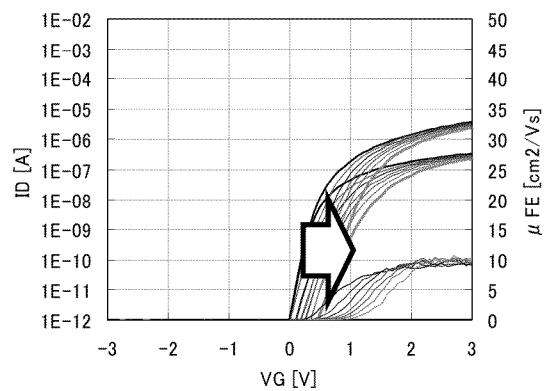
Figure 27A:
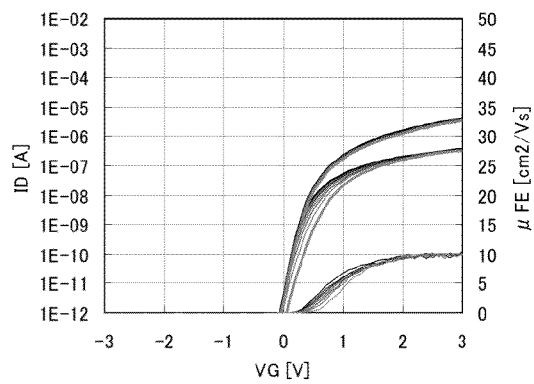
FIGS. 27A to 27D show electrical characteristics of transistors.
Figure 27B:
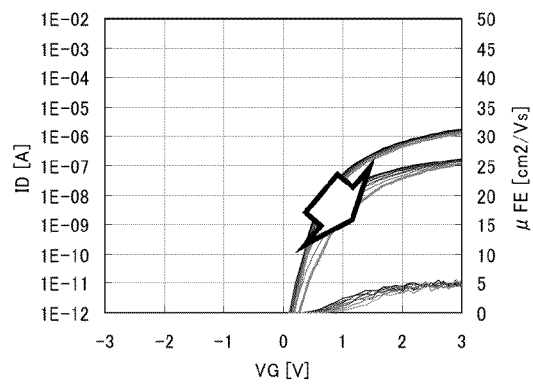
Figure 27C:
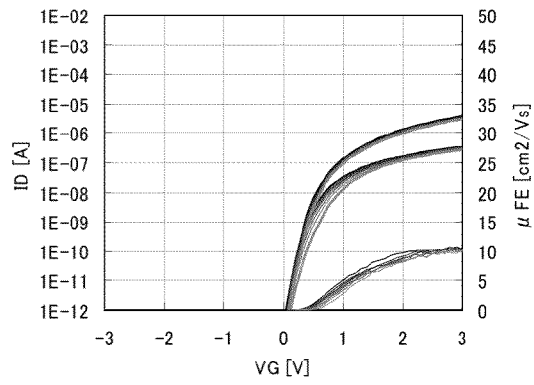
Figure 27D:
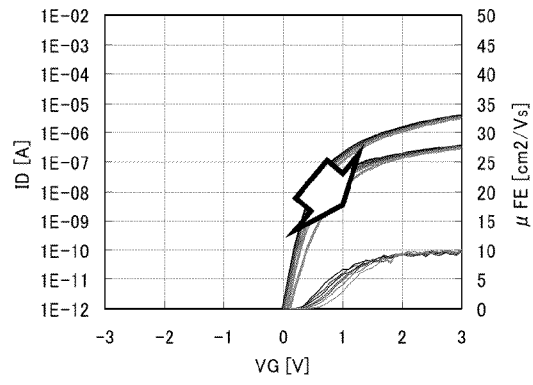

FIGS. 22A to 22D show the measurement results of the transistor having a channel length L of 0.48 μm and a channel width of 0.8 μm. FIGS. 23A to 23D show the measurement results of the transistor having a channel length L of 0.83 μm and a channel width of 0.8 μm. FIGS. 24A to 24D show the measurement results of the transistor having a channel length L of 0.83 μm and a channel width of 50 μm. FIGS. 22A, 23A, and 24A show the measurement results of the transistors with the $GaO_x$ film. FIGS. 22B, 23B, and 24B show the measurement results of the transistors with the GZO(2:1) film. FIGS. 22C, 23C, and 24C show the measurement results of the transistors with the GZO(10:1) film. FIGS. 22D, 23D, and 24D show the measurement results of the transistors with the GZO(20:1) film.

FIGS. 22A to 22D, FIGS. 23A to 23D, and FIGS. 24A to 24D show that there is a significant difference between the rising positions at drain voltages of 0.1 V and 1.8 V when the amount of Zn is too large, but the GZO(20:1) film and the GZO(10:1) film with small amounts of Zn hardly differ from the $GaO_x$ film.

Next, the above-fabricated transistors having a channel length L of 0.83 μm and a channel width W of 0.8 μm were subjected to a stress test at 150° C. for one hour with the source voltage ($V_s$: [V]) and the drain voltage ($V_d$: [V]) set to 0 V and with a gate voltage of 3.3 V applied (the stress test is hereinafter also referred to as +GBT test), and the drain current ($I_d$: [A]) was measured. FIGS. 25A to 25D show the measurement results obtained at $V_d$=1.8 V. In FIGS. 25A to 25D, the horizontal axis represents gate voltage ($V_G$: [V]) and the vertical axis represents drain current ($I_D$: [A]). In addition, the field-effect mobility ($\mu_{FE}$: [$cm^2$/Vs]) at $V_d$=0.1 V is shown. FIGS. 25A, 25B, 25C, and 25D show the measurement results of the transistor with the $GaO_x$ film, the transistor with the GZO(2:1) film, the transistor with the GZO(10:1) film, and the transistor with the GZO(20:1) film, respectively.

In addition, the above-fabricated transistors having a channel length L of 0.83 μm and a channel width W of 0.8 μm were subjected to a stress test at 150° C. for one hour with the source voltage ($V_s$: [V]) and the drain voltage ($V_d$: [V]) set to 0 V and with a gate voltage of −3.3 V applied (the stress test is hereinafter also referred to as −GBT test), and the drain current ($I_d$: [A]) was measured. FIGS. 26A to 26D show the measurement results obtained at $V_d$=1.8 V. In FIGS. 26A to 26D, the horizontal axis represents gate voltage ($V_G$: [V]) and the vertical axis represents drain current ($I_D$: [A]). In addition, the field-effect mobility ($\mu_{FE}$: [$cm^2$/Vs]) at $V_d$=0.1 V is shown. FIGS. 26A, 26B, 26C, and 26D show the measurement results of the transistor with the $GaO_x$ film, the transistor with the GZO(2:1) film, the transistor with the GZO(10:1) film, and the transistor with the GZO(20:1) film, respectively.

In addition, the above-fabricated transistors having a channel length L of 0.83 μm and a channel width W of 0.8 μm were subjected to a stress test at 150° C. for one hour with the source voltage ($V_s$: [V]) and the gate voltage ($V_g$: [V]) set to 0 V and with a drain voltage of 1.8 V applied (the stress test is hereinafter also referred to as +DBT test), and the drain current ($I_d$: [A]) was measured. FIGS. 27A to 27D show the measurement results obtained at $V_d$=1.8 V. In FIGS. 27A to 27D, the horizontal axis represents gate voltage ($V_G$: [V]) and the vertical axis represents drain current ($I_D$: [A]). In addition, the field-effect mobility ($\mu_{FE}$: [$cm^2$/Vs]) at $V_d$=0.1 V is shown. FIGS. 27A, 27B, 27C, and 27D show the measurement results of the transistor with the $GaO_x$ film, the transistor with the GZO(2:1) film, the transistor with the GZO(10:1) film, and the transistor with the GZO(20:1) film, respectively.

Note that arrows in FIGS. 25A to 25D, FIGS. 26A to 26D, and FIGS. 27A to 27D indicate changes in electrical characteristics through the stress tests. FIGS. 25A to 25D, FIGS. 26A to 26D, and FIGS. 27A to 27D demonstrate that the threshold voltage of the transistor with the $GaO_x$ film is shifted in the positive direction through the −GBT test, whereas the threshold voltage of the transistor with the GZO(10:1) film shows less change through the −GBT test. It is also demonstrated that the threshold voltage of the transistor with the GZO(10:1) film shows less change through the +DBT test as well.

Example 4

In this example, the leakage current of the transistor fabricated in Example 3 which has a channel length L of 0.83 μm and a channel width W of 0.8 μm and includes the GZO(10:1) film as the metal oxide film was measured.

The measurement was carried out after 10 hours at 125° C., and also after 72 hours at 85° C.

Figure 28:
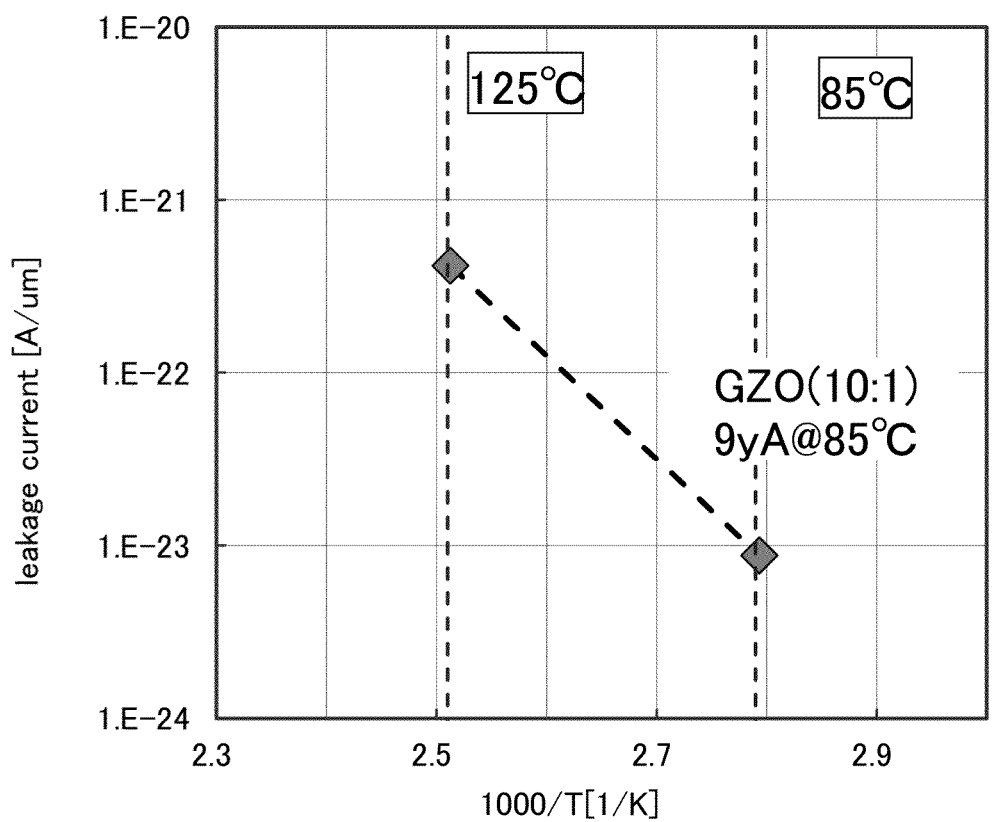
FIG. 28 shows measurement results of leakage current of a transistor.

FIG. 28 shows the relationships between leakage current and the inverse of substrate temperature (absolute temperature) at the measurement. For easy understanding, the horizontal axis represents a value (1000/T) [1/K] obtained by multiplying the inverse of substrate temperature at the measurement by 1000.

FIG. 28 shows that the leakage current measured after 72 hours at 85° C. is 9 yA/μm.

Example 5

In this example, SIMS measurement results of the samples fabricated in Examples 1 and 2 (the GZO(2:1) film, the GZO(3:1) film, the GZO(5:1) film, the GZO(10:1) film, and the GZO(20:1) film) will be described.

Figure 30:
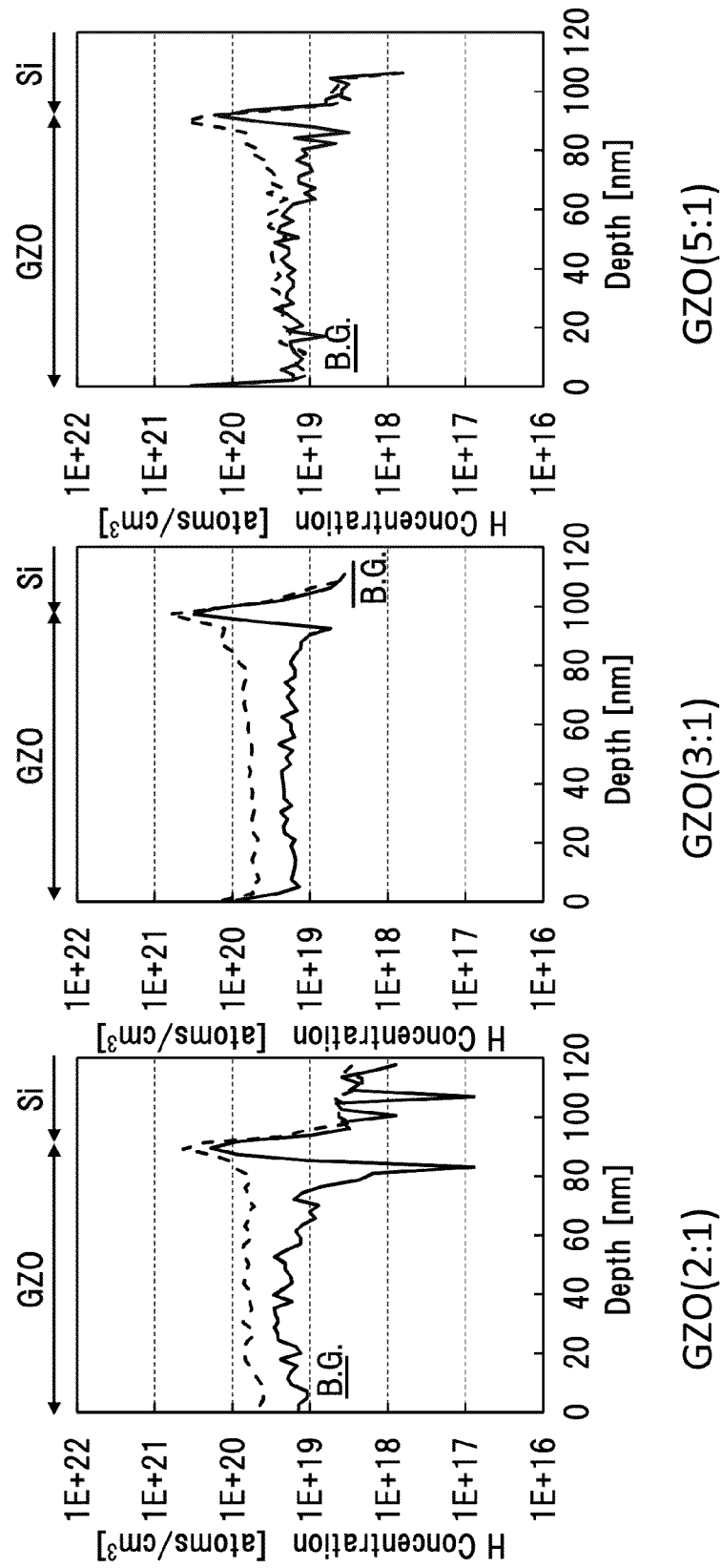
FIG. 30 shows SIMS measurement results.
Figure 31:
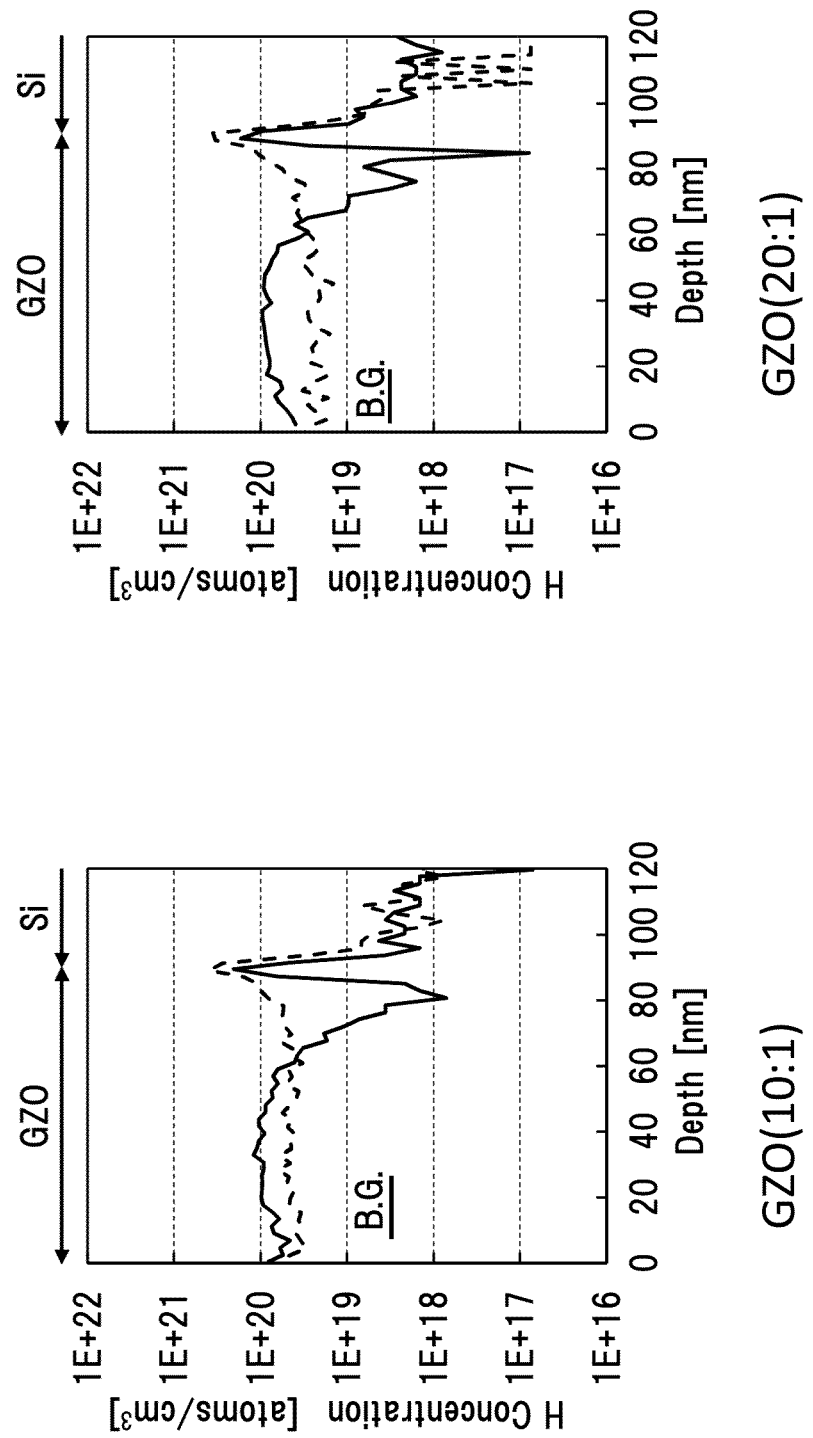
FIG. 31 shows SIMS measurement results.

FIG. 30 shows the hydrogen (H) concentration profiles of the GZO(2:1) film, the GZO(3:1) film, and the GZO(5:1) film, and FIG. 31 shows the hydrogen (H) concentration profiles of the GZO(10:1) film and the GZO(20:1) film. Note that in each graph, the solid line shows the measurement result obtained after the sample was subjected to heat treatment for one hour in a nitrogen atmosphere at 450° C. and heat treatment for one hour in an oxygen atmosphere at 450° C., and the broken line shows the result obtained before the sample was subjected to the heat treatments. In addition, "B.G." in each graph shows the lower measurement limit.

FIGS. 30 and 31 demonstrate that when the proportion of gallium in a metal oxide film is higher than that in the GZO(5:1) film, the hydrogen concentration in the film is not easily decreased by heat treatment.

According to the above examples and this example, it is most preferable that the proportion of gallium in a metal oxide film be within the range from that in the GZO(5:1) film to that in the GZO(10:1) film.

EXPLANATION OF REFERENCE

100: substrate, 101a: oxide semiconductor film, 101b: oxide semiconductor film, 101c: oxide semiconductor film, 102: base insulating film, 103a: source electrode, 103b: drain electrode, 104: gate insulating film, 105: gate electrode, 107: insulating film, 108: insulating film, 109a: insulating film, 109b: insulating film, 110a: wiring, 110b: wiring, 111: metal oxide film, 113a: layer, 113b: layer, 115a: wiring, 115b: wiring, 141: low-resistance region, 142: low-resistance region, 150: transistor, 150a: transistor, 150b: transistor, 150c: transistor, 150d: transistor, 700: substrate, 701: pixel portion, 702: scan line driver circuit, 703: scan line driver circuit, 704: source line driver circuit, 710: capacitor wiring, 712: gate wiring, 713: gate wiring, 714: data line, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power supply line, 728: common electrode, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: display portion, 933: wristband, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 2201: insulating film, 2202: wiring, 2203: plug, 2204: insulating film, 2205: wiring, 2206: wiring, 2207: insulating film, 2208: blocking film, 2211: semiconductor substrate, 2212: insulating film, 2213: gate electrode, 2214: gate insulating film, 2215: source and drain regions, 3001: wiring, 3002: wiring, 3003: wiring, 3004: wiring, 3005: wiring, 3200: transistor, 3300: transistor, 3400: capacitor, 4000: RF device, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, and 8011: battery.

This application is based on Japanese Patent Application serial no. 2014-122284 filed with Japan Patent Office on Jun. 13, 2014, the entire contents of which are hereby incorporated by reference.

The invention claimed is:

1. A semiconductor device comprising:
   a first oxide semiconductor film;
   a second oxide semiconductor film over the first oxide semiconductor film;
   a source electrode comprising a region in contact with the second oxide semiconductor film;
   a drain electrode comprising a region in contact with the second oxide semiconductor film;
   a metal oxide film over the second oxide semiconductor film, the source electrode, and the drain electrode;
   a gate insulating film over the metal oxide film; and
   a gate electrode over the gate insulating film,
   wherein the metal oxide film comprises an element M (M represents Ti, Ga, Y, Zr, La, Ce, Nd, or Hf) and Zn, and
   wherein the metal oxide film comprises a portion where $x/(x+y)$ is greater than 0.67 and less than or equal to 0.99 when an atomic ratio of the element M to Zn in a target is represented by M:Zn=x:y.

2. The semiconductor device according to claim 1, wherein the element M is Ga.

3. The semiconductor device according to claim 1, wherein the second oxide semiconductor film comprises a plurality of crystal parts having c-axis alignment, and c-axes of the plurality of crystal parts are aligned in a direction parallel to a normal vector to an upper surface of the second oxide semiconductor film.

4. The semiconductor device according to claim 1, wherein a channel length is greater than or equal to 5 nm and less than or equal to 200 nm.

5. The semiconductor device according to claim 1, wherein an electron affinity of the second oxide semiconductor film is higher than an electron affinity of the first oxide semiconductor film.

6. An electronic device comprising the semiconductor device according to claim 1.

7. A semiconductor device comprising:
a first oxide semiconductor film;
a second oxide semiconductor film over the first oxide semiconductor film;
a source electrode comprising a region in contact with the second oxide semiconductor film;
a drain electrode comprising a region in contact with the second oxide semiconductor film;
a metal oxide film over the second oxide semiconductor film, the source electrode, and the drain electrode;
a gate insulating film over the metal oxide film; and
a gate electrode over and in contact with the gate insulating film and facing an upper surface and a side surface of the second oxide semiconductor film,
wherein the metal oxide film comprises an element M (M represents Ti, Ga, Y, Zr, La, Ce, Nd, or Hf) and Zn, and
wherein the metal oxide film comprises a portion where $x/(x+y)$ is greater than 0.67 and less than or equal to 0.99 when an atomic ratio of the element M to Zn in a target is represented by M:Zn=x:y.

8. The semiconductor device according to claim 7, wherein the element M is Ga.

9. The semiconductor device according to claim 7, wherein the second oxide semiconductor film comprises a plurality of crystal parts having c-axis alignment, and c-axes of the plurality of crystal parts are aligned in a direction parallel to a normal vector to the upper surface of the second oxide semiconductor film.

10. The semiconductor device according to claim 7, wherein a channel length is greater than or equal to 5 nm and less than or equal to 200 nm.

11. The semiconductor device according to claim 7, wherein an electron affinity of the second oxide semiconductor film is higher than an electron affinity of the first oxide semiconductor film.

12. An electronic device comprising the semiconductor device according to claim 7.

13. A method for manufacturing a semiconductor device, comprising the steps of:
forming a first insulating film over a substrate;
forming a first oxide semiconductor film over the first insulating film;
forming a second oxide semiconductor film over the first oxide semiconductor film;
forming a source electrode and a drain electrode over the second oxide semiconductor film;
forming a metal oxide film over the second oxide semiconductor film, the source electrode, and the drain electrode, the metal oxide film comprising Zn and an element selected from the group consisting of Ti, Ga, Y, Zr, La, Ce, Nd, and Hf;
forming a gate insulating film over the metal oxide film; and
forming a gate electrode over the gate insulating film,
wherein the metal oxide film is formed by a sputtering method using a sputtering target,
wherein an atomic ratio of the element M to Zn in the sputtering target is represented by M:Zn=x:y, and
wherein $x/(x+y)$ is greater than 0.67 and less than or equal to 0.99.

14. The method according to claim 13, wherein the first oxide semiconductor film is formed by a sputtering method at a substrate temperature higher than or equal to 150° C. and lower than or equal to 450° C.

15. The method according to claim 13, further comprising the step of forming a second insulating film over the gate electrode.

16. The method according to claim 13, further comprising a step of performing a heat treatment after forming the first oxide semiconductor film.

17. The method according to claim 13, wherein the sputtering target for forming the metal oxide film comprises Ga and Zn.

18. The method according to claim 13, wherein the second oxide semiconductor film comprises a plurality of crystal parts having c-axis alignment, and c-axes of the plurality of crystal parts are aligned in a direction parallel to a normal vector to an upper surface of the second oxide semiconductor film.

19. The method according to claim 13, wherein a channel length is greater than or equal to 5 nm and less than or equal to 200 nm.

20. The method according to claim 13, wherein an electron affinity of the second oxide semiconductor film is higher than an electron affinity of the first oxide semiconductor film.

21. A semiconductor device comprising:
a first oxide semiconductor film;
a second oxide semiconductor film over the first oxide semiconductor film;
a source electrode comprising a region in contact with the second oxide semiconductor film;
a drain electrode comprising a region in contact with the second oxide semiconductor film;
a metal oxide film over the second oxide semiconductor film;
a gate insulating film over the metal oxide film; and
a gate electrode over the gate insulating film,
wherein the metal oxide film comprises an element M (M represents Ti, Ga, Y, Zr, La, Ce, Nd, or Hf) and Zn,
wherein the metal oxide film comprises a portion where $x/(x+y)$ is greater than 0.67 and less than or equal to 0.99 when an atomic ratio of the element M to Zn is represented by M:Zn=x:y, and
wherein the metal oxide film is in contact with the second oxide semiconductor film.

22. The semiconductor device according to claim 21, wherein the element M is Ga.

23. The semiconductor device according to claim 21, wherein the second oxide semiconductor film comprises a plurality of crystal parts having c-axis alignment, and c-axes of the plurality of crystal parts are aligned in a direction parallel to a normal vector to an upper surface of the second oxide semiconductor film.

24. The semiconductor device according to claim 21, wherein a channel length is greater than or equal to 5 nm and less than or equal to 200 nm.

25. The semiconductor device according to claim 21, wherein an electron affinity of the second oxide semiconductor film is higher than an electron affinity of the first oxide semiconductor film.

26. An electronic device comprising the semiconductor device according to claim 21.

* * * * *